United States Patent
Hirano et al.

(10) Patent No.: US 7,851,281 B2
(45) Date of Patent: Dec. 14, 2010

(54) MANUFACTURING METHOD OF FLEXIBLE SEMICONDUCTOR DEVICE AND FLEXIBLE SEMICONDUCTOR DEVICE

(75) Inventors: Koichi Hirano, Osaka (JP); Seiichi Nakatani, Osaka (JP); Shingo Komatsu, Osaka (JP); Yoshihisa Yamashita, Kyoto (JP); Takashi Ichiryu, Osaka (JP)

(73) Assignee: Panasonic Corporation, Osaka (JP)

( * ) Notice: Subject to any disclaimer, the term of this patent is extended or adjusted under 35 U.S.C. 154(b) by 28 days.

(21) Appl. No.: 12/518,602

(22) PCT Filed: Oct. 1, 2008

(86) PCT No.: PCT/JP2008/002759
§ 371 (c)(1),
(2), (4) Date: Jun. 10, 2009

(87) PCT Pub. No.: WO2009/069248
PCT Pub. Date: Apr. 6, 2009

(65) Prior Publication Data
US 2010/0012936 A1   Jan. 21, 2010

(30) Foreign Application Priority Data
Nov. 28, 2007   (JP)   ............................. 2007-306755

(51) Int. Cl.
*H01L 21/336*   (2006.01)
(52) U.S. Cl. ................................ 438/158; 257/E21.414
(58) Field of Classification Search ......... 438/141–142, 438/149–155, 158–159, 209–210
See application file for complete search history.

(56) References Cited

U.S. PATENT DOCUMENTS

| 5,580,796 | A * | 12/1996 | Takizawa et al. ............ 438/158 |
| 7,176,697 | B1 * | 2/2007 | Dahan ........................ 324/643 |
| 2008/0121885 | A1 * | 5/2008 | Kuo ............................. 257/59 |
| 2008/0210946 | A1 * | 9/2008 | Okada et al. .................. 257/71 |
| 2008/0258138 | A1 * | 10/2008 | Song et al. ..................... 257/40 |
| 2009/0045402 | A1 * | 2/2009 | Kuo ............................. 257/59 |
| 2009/0108280 | A1 * | 4/2009 | Jan et al. ....................... 257/98 |
| 2009/0108371 | A1 * | 4/2009 | Nakayama et al. .......... 257/379 |
| 2009/0209069 | A1 * | 8/2009 | Hirakata et al. ............. 438/158 |

(Continued)

FOREIGN PATENT DOCUMENTS

JP   2003-258261   9/2003

(Continued)

*Primary Examiner*—Savitri Mulpuri
(74) *Attorney, Agent, or Firm*—McDermott Will & Emery LLP

(57) ABSTRACT

A layered film of a three-layer clad foil formed with a first metal layer 23, a second metal layer 25, and an inorganic insulating layer 35 interposed therebetween is prepared. After the second metal layer 25 is partially etched to form a gate electrode 20g, the first metal layer 23 is partially etched to form source/drain electrodes 20s, 20d in a region corresponding to the gate electrode 20g. A semiconductor layer 40 is then formed in contact with the source/drain electrodes 20s, 20d and on the gate electrode 20g with the inorganic insulating layer 35 interposed therebetween. The inorganic insulating layer 35 on the gate electrode 20g functions as a gate insulating film 30, and the semiconductor layer 40 between the source/drain electrodes 20s, 20d on the inorganic insulating layer 35 functions as a channel.

20 Claims, 18 Drawing Sheets

U.S. PATENT DOCUMENTS

2010/0151622 A1* 6/2010 Suh et al. .................. 438/99
2010/0173451 A1* 7/2010 Cho et al. .................. 438/99

FOREIGN PATENT DOCUMENTS

| JP | 2005-123290 | 5/2005 |
| JP | 2005-166742 | 6/2005 |
| JP | 2005-294300 | 10/2005 |
| JP | 2006-186294 | 7/2006 |
| JP | 2007-067263 | 3/2007 |
| JP | 2007-073857 | 3/2007 |

* cited by examiner (a)

(b)

(c)

(d)

(a)

(b)

(c)

(d)

(a)

(b)

(a)

(b)

(c)

(a)

(b)

(c)

(a)

(b)

MANUFACTURING METHOD OF FLEXIBLE SEMICONDUCTOR DEVICE AND FLEXIBLE SEMICONDUCTOR DEVICE

RELATED APPLICATIONS

This application is the U.S. National Phase under 35 U.S.C. §371 of International Application No. PCT/JP2008/002759, filed on Oct. 1, 2008, which in turn claims the benefit of Japanese Application No. 2007-306755, filed on Nov. 28, 2007, the disclosures of which Applications are incorporated by reference herein.

TECHNICAL FIELD

The present invention relates to a manufacturing method of a flexible semiconductor device having a thin film transistor, and a flexible semiconductor device.

BACKGROUND ART

With popularization of information terminals, there has been a growing demand for a flat panel display as a computer display. Moreover, with progress in information technology, information conventionally provided on a paper medium has been increasingly provided as electronic data. Electronic paper or digital paper has therefore been increasingly demanded as a thin, lightweight, easily portable mobile display medium.

In a flat panel display device, a display medium is generally formed by using an element utilizing liquid crystal, organic EL (organic electroluminescence), electrophoresis and the like. In such a display medium, a technology using an active driving element (TFT element) as an image driving element has been widely used in order to assure uniformity of screen brightness, a screen rewriting speed, and the like. In a typical computer display, for example, TFT elements are formed on a glass substrate and a liquid crystal, organic EL elements, or the like are sealed.

In this case, semiconductors such as a-Si (amorphous silicon) and p-Si (polysilicon) can be mainly used for the TFT elements. The TFT elements are manufactured by forming multiple layers of the Si semiconductors (and a metal film if necessary) and sequentially forming source, drain and gate electrodes on the substrate. Manufacturing of such TFT elements usually requires sputtering and other manufacturing processes of a vacuum system.

In manufacturing of such TFT elements, however, a manufacturing process of a vacuum system including a vacuum chamber needs to be repeated many times to form the layers, resulting in extremely high device cost and running cost. For example, processes such as vacuum deposition, doping, photolithography, and development usually need to be repeatedly performed to form the layers of the TFT elements, and the elements are formed on a substrate through several tens of processes. Even for a semiconductor portion that is critical for switching operation, a plurality of types of semiconductor layers such as p-type and n-type are stacked. In such a conventional Si semiconductor manufacturing method, drastic design change in a manufacturing apparatus such as a vacuum chamber is required for the needs for large-size display screens, and it is not easy to change facilities.

Moreover, formation of such conventional TFT elements using a Si material involves a high temperature process, adding a limitation on a substrate material that the substrate material needs to be resistant to the process temperature. Accordingly, glass needs to be used for practical applications.

When a thin display such as electronic paper or digital paper as described above is formed by using the conventionally known TFT elements, the display is heavy, has poor flexibility, and may be broken if dropped. These characteristics resulting from forming the TFT elements on the glass substrate are not desirable to satisfy the needs for handy portable thin displays which have risen with progress in information technology.

On the other hand, organic semiconductor materials have been actively studied as organic compounds having high charge transportability. These compounds have been expected to be applied to organic laser oscillation elements and organic thin film transistor elements (organic TFT elements) in addition to a charge transportable material for organic EL elements.

If such organic semiconductor devices can be implemented, vacuum to low-pressure vapor deposition may be performed at a relatively low temperature, whereby the manufacturing process is simplified. Moreover, a semiconductor that can be brought into a solution may be obtained by appropriately improving the molecular structure. Therefore, manufacturing by using a printing method including an inkjet method may be implemented by using ink made of an organic semiconductor solution (Patent document 1 and the like).

Such manufacturing by the low temperature processes has been considered to be impossible for devices using the conventional Si semiconductor materials, but may be possible for devices using organic semiconductors. The above-described limitation regarding the heat resistance of the substrate is therefore reduced, and the TFT elements, for example, may be formed on a transparent resin substrate. If the TFT elements can be formed on the transparent resin substrate and a display material can be driven by the TFT elements, displays that are lighter and more flexible than the conventional displays and are not broken (or are unlikely to be broken) even if dropped can be implemented.

Patent document 1: Japanese Patent Laid-Open Publication No. 2007-67263

Patent document 2: Japanese Patent Laid-Open Publication No. 2006-186294

DISCLOSURE OF THE INVENTION

Problems to be Solved by the Invention

Printed electronics has been drawing attention for implementation of such organic semiconductor devices or flexible semiconductor devices as described above.

FIG. 1 schematically shows a cross-sectional structure of a flexible semiconductor device 1000 including an organic semiconductor 140 using a printing method. The flexible semiconductor device 100 shown in FIG. 1 has a structure in which layers (120, 130, 140, 150) are formed over a resin substrate (e.g., PET or PI) 110 by printing. In the structure shown in the figure, a wiring layer 120, an insulating layer 130, an organic semiconductor layer 140, and a wiring layer 150 are sequentially formed over the resin substrate 110. Although a specific structure may be modified as appropriate, a source electrode 120s, a drain electrode 120d, and a gate electrode 150g are provided around the organic semiconductor layer 140 to form an organic transistor.

Such a printed electronics technology using a printing method has various advantages such as reduction of a vacuum process (vacuum-less process) and execution of a low temperature process (process involving no high temperature process). Moreover, the use of the printing method enables execution of a process that involves no photolithography process (photolithography-less process). Although having been drawing attention because of its various advantages, the printed electronics still have many problems to be solved as described below, according to the studies of the inventors of the present application.

First, in the case where the wiring layers 120, 150 are formed by the printing method, it is necessary to form wirings of a nano-paste material by an inkjet method. The nano-paste material is expensive and the wirings made of the nano-paste material have a high resistance. The use of the printing method is therefore problematic in this point.

Patent document 2 discloses a thin film transistor having a polymeric film as a gate insulating film. Although a thinner gate insulating film is more preferable to reduce the gate voltage, there are still problems to be solved in production technology such as how to handle such a gate insulating film made of a thin polymeric film (e.g., a preferred transportation method and a preferred formation method of the gate insulating film). Such problems are significant especially in a flexible semiconductor device for a large screen display.

The inventors of the present application had attempted to seek solutions to the above problems from a new perspective rather than seeking solutions from a conventional perspective. The present invention is made in view of the above problems and it is a primary object of the present invention to provide a flexible semiconductor device having excellent productivity.

Means for Solving the Problems

In a method employed in the present invention in order to achieve the above object, a layered film of a three-layer clad foil formed with a first metal layer, a second metal layer, and an inorganic insulating layer interposed therebetween is used as a base structure. The first metal layer and the second metal layer are processed to form a gate electrode and source/drain electrodes. The inorganic insulating layer on the gate electrode functions as a gate insulating film, and a semiconductor layer functioning as a channel is formed on the inorganic insulating layer. A flexible semiconductor device including a thin film transistor having an inorganic insulating layer as a base material can thus be manufactured without using a vacuum process.

More specifically, a method for manufacturing a flexible semiconductor device according to the present invention is a method for manufacturing a flexible semiconductor device including a thin film transistor. The method includes the steps of: (a) preparing a layered film of a three-layer clad foil formed with a first metal layer, a second metal layer, and an inorganic insulating layer interposed therebetween; (b) partially etching the second metal layer to form a gate electrode; (c) partially etching the first metal layer to form source/drain electrodes in a region corresponding to the gate electrode; and (d) forming a semiconductor layer in contact with the source/drain electrodes and on the gate electrode with the inorganic insulating layer interposed therebetween. The inorganic insulating layer on the gate electrode functions as a gate insulating film, and the semiconductor layer between the source/drain electrodes on the inorganic insulating layer functions as a channel.

In a preferred embodiment, the method further includes the step of, after the step (b), pressure-contacting the gate electrode to an upper surface of a resin film to embed the gate electrode in the resin film.

In this case, the resin film having a larger thickness than that of the inorganic insulating layer is used as a base material of the flexible semiconductor device instead of the inorganic insulating layer, whereby a large area flexible semiconductor device can be stably manufactured.

In a preferred embodiment, the method further includes the step of forming a third metal layer on a lower surface of the resin film.

In this case, the lower surface of the resin film used as a base material can be used as a wiring region made of the third metal layer. Accordingly, electrical connection between a plurality of thin film transistors formed on the upper surface of the resin film can be easily obtained.

More specifically, electrical connection between the gate electrode or/and the source/drain electrodes of the thin film transistor and the third metal layer can be obtained by forming a via in the resin film by the following method:

The resin film has openings extending from the upper surface to the lower surface of the resin film. A paste via is formed in the openings by filing the openings with a conductive paste. In the step of embedding the gate electrode in the resin film, the gate electrode or/and the source/drain electrodes are pressure-contacted so as to be in contact with an upper surface of the respective paste vias.

Alternatively, the method further includes the step of, after forming the third metal layer, forming in the resin film a plating via electrically connecting the gate electrode or/and the source/drain electrodes to the third metal layer.

Alternatively, the third metal layer and a plating via electrically connecting the third metal layer to the gate electrode or/and the source/drain electrodes are formed in the step of forming the third metal layer.

In a preferred embodiment, the method further includes the step of partially etching the third metal layer to form a gate line electrically connected to the gate electrode through the via.

In a preferred embodiment, in the step of forming the gate line, the third metal layer is partially etched to form the gate line and a wiring layer electrically connected to the source/drain electrodes.

In a preferred embodiment, the first metal layer and the second metal layer of the step (a) are made of a copper foil, a nickel foil, or an alloy foil containing one of copper and nickel.

In a preferred embodiment, the step (b) includes the step of etching the inorganic insulating layer.

In a preferred embodiment, in the step (c), the first metal layer is partially etched to form the source/drain electrodes and a wiring layer connected to the source/drain electrodes.

In a preferred embodiment, the inorganic insulating layer is made of a material selected from the group consisting of a titanium oxide, a tantalum oxide, an aluminum oxide, and a niobium oxide.

In a preferred embodiment, the inorganic insulating layer is a film having a relative dielectric constant of 8 or more and a thickness of 2 µm or less.

In a preferred embodiment, the step (a) includes the steps of preparing the second metal layer, forming the inorganic insulating layer on the second layer, and forming the first metal layer on the inorganic insulating layer.

In a preferred embodiment, the inorganic insulating layer is made of a metal oxide film formed by oxidizing an upper surface of the second metal layer. Preferably, the upper surface of the second metal layer is oxidized by anodization.

In a preferred embodiment, the second metal layer is made of aluminum or tantalum.

In a preferred embodiment, the metal oxide film is a surface-oxidized film having a relative dielectric constant of 8 or more and a thickness of 2 µm or less.

In a preferred embodiment, the semiconductor layer is made of an organic semiconductor material.

In a preferred embodiment, in the step (b), the second metal layer is partially etched to simultaneously form the gate electrode and a lower electrode of a capacitor. In the step (c), the first metal layer is partially etched to simultaneously form the source/drain electrodes and an upper electrode of the capacitor. The inorganic insulating layer between the lower electrode and the upper electrode functions as a dielectric layer of the capacitor.

A flexible semiconductor device according to the present invention is a flexible semiconductor device including a thin film transistor manufactured by the method described above. The flexible semiconductor device includes: a resin film; a second metal layer embedded in the resin film and functioning as a gate electrode; an inorganic insulating layer formed on an upper surface of the second metal layer and functioning as a gate insulating film; and a first metal layer formed on an upper surface of the resin film and functioning as source/drain electrodes. A semiconductor layer is formed on the gate electrode with the inorganic insulating layer interposed therebetween, and the semiconductor layer is provided so as to be in contact with the source/drain electrodes.

In a preferred embodiment, the resin film has a via connected to the second metal layer embedded in the resin film.

In a preferred embodiment, a third metal layer including a gate line is formed on a lower surface of the resin film, and the gate line is electrically connected to the gate electrode through the via.

In a preferred embodiment, the flexible semiconductor device further includes a capacitor, a dielectric layer of the capacitor is made of the inorganic insulating layer, and an upper electrode and a lower electrode of the capacitor are made of the first metal layer and the second metal layer, respectively.

In a preferred embodiment, the inorganic insulating layer is made of a material selected from the group consisting of a titanium oxide, a tantalum oxide, an aluminum oxide, and a niobium oxide.

In a preferred embodiment, the inorganic insulating layer is made of a metal oxide film of a metal of the second metal layer.

A layered film according to the present invention is a layered film used in the manufacturing method of the flexible semiconductor device described above. The layered film is a three-layer clad foil formed with a first metal layer, a second metal layer, and an inorganic insulating layer interposed therebetween. The second metal layer is partially etched to form a gate electrode, the first metal film is partially etched to form source/drain electrodes, and the inorganic insulating layer on the gate electrode functions as a gate insulating film.

In a preferred embodiment, the inorganic insulating layer is made of a material selected from the group consisting of a titanium oxide, a tantalum oxide, an aluminum oxide, and a niobium oxide.

In a preferred embodiment, the inorganic insulating layer is made of a metal oxide film of a metal of the second metal layer.

Effects of the Invention

According to the manufacturing method of the flexible semiconductor device of the present invention, a TFT structure (a gate insulating film, a gate electrode, and source/drain electrodes) can be formed in a simple manner by using a layered film of a three-layer clad foil formed with a first metal layer, a second metal layer, and an inorganic insulating layer interposed therebetween. A flexible semiconductor device including a gate insulating film made of an inorganic insulating material having a higher dielectric constant than that of a polymeric film can therefore be manufactured by a simple and easy process. Moreover, since the flexible semiconductor device can be fabricated without using a vacuum process, a flexible semiconductor device having excellent productivity can be provided.

Moreover, although the inorganic insulating layer is used, a flexible semiconductor device can be manufactured by a low temperature process. In other words, the inorganic insulating layer is fabricated in advance by a high temperature process (typically, a part of a vacuum process such as thermal oxidation, a vacuum deposition method, a sputtering method, and a CVD method), and a low temperature process is then performed by using a resin film. After the inorganic insulating layer is prepared, it is therefore not necessary to introduce a high temperature process in the manufacturing process using the resin film. Accordingly, although the inorganic insulating layer is used, the manufacturing process can be performed by using the resin film without using a glass substrate that can be resistant to a high temperature process. The flexible semiconductor device can thus be manufactured in a simple and easy manner.

Figure 1:
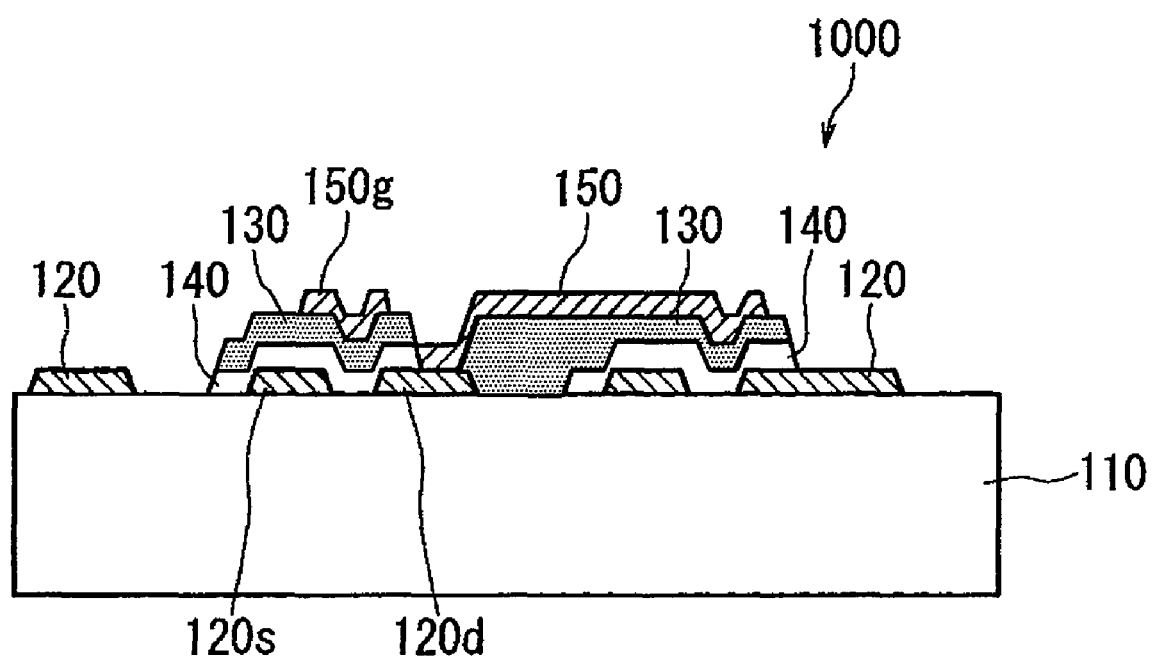
FIG. 1 is a diagram schematically showing a cross-sectional structure of a conventional flexible semiconductor device.

DESCRIPTION OF THE REFERENCE NUMERALS 10 resin film
13 opening
16, 16c, 17 via
19 hole
20g gate electrode
20s source electrode
20d drain electrode
23 first metal layer
24 gate line
25 second metal layer
26 wiring layer
27 third metal layer
30 gate insulating film
35 inorganic insulating layer
36 layered film
40 semiconductor layer
50 protective film
52 copper layer
54 resist
80 capacitor
82 dielectric layer
84 upper electrode layer
86 lower electrode layer
90 flexible semiconductor device assembly
92, 94 wiring
100A switching transistor
100B driver transistor
100 flexible semiconductor device

BEST MODE FOR CARRYING OUT THE INVENTION

Hereinafter, embodiments of the present invention will be described with reference to the accompanying drawings. For simplification of description, elements having substantially the same function are denoted by the same reference numerals and characters throughout the figures. Note that the present invention is not limited to the following embodiments.

Figure 2:
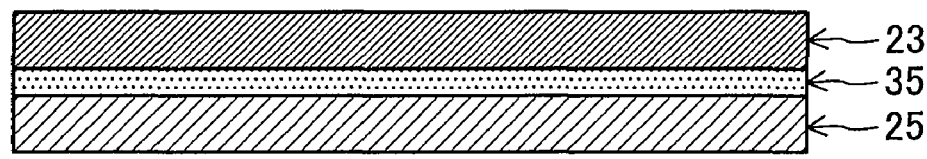
FIGS. 2(a) through 2(d) are cross-sectional views illustrating basic steps of a manufacturing method of a flexible semiconductor device according to an embodiment of the present invention.
Figure 2:
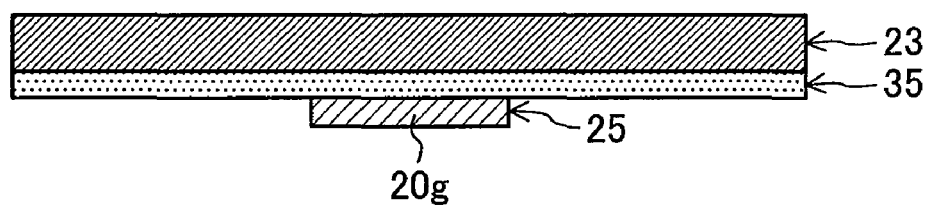
Figure 2:
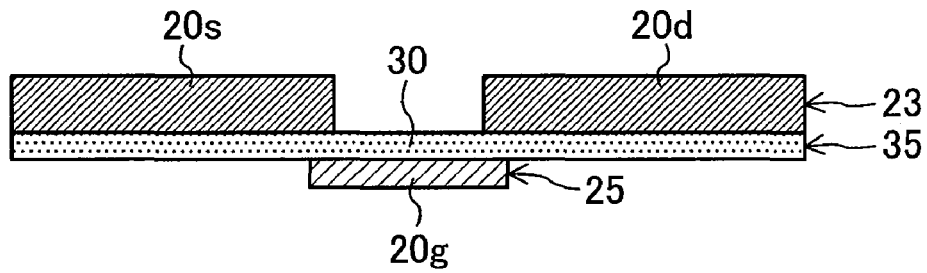
Figure 2:
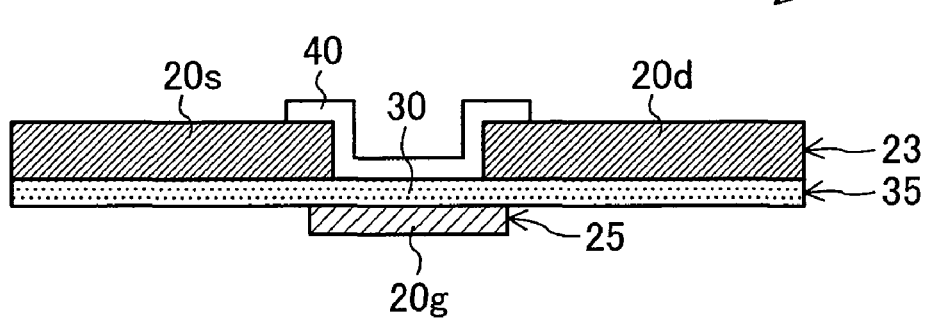

FIG. 2 shows cross-sectional views showing basic processes of a manufacturing method of a flexible semiconductor device 100 according to an embodiment of the present invention.

First, a layered film of a three-layer clad foil is prepared as shown in FIG. 2(a). The three-layer clad foil is made of a first metal layer 23 and a second metal layer 25 respectively formed on both surfaces of an inorganic insulating layer 35. The first metal layer 23 and the second metal layer 25 may be made of either the same material or different materials. Although the inorganic insulating layer 35 may be made of any material, the inorganic insulating layer is desirably a thin film having a high relative dielectric constant in order to function as a gate insulating film of a thin film transistor. Note that the layered film of the three-layer clad foil can be formed by various methods described below.

As shown in FIG. 2(b), the second metal layer 25 is then partially etched to form a gate electrode 20g of a thin film transistor. Thereafter, as shown in FIG. 2(c), the first metal layer 23 is partially etched to form a source electrode 20s and a drain electrode 20d (hereinafter, simply referred to as "source/drain electrodes") in a region corresponding to the gate electrode 20g.

Etchants of the second metal layer 25 and the first metal layer 23 may be selected according to the respective materials of the second material layer 25 and the first metal layer 23, and either a wet etching method or a dry etching method may be used. The gate electrode 20g may be formed after the source/drain electrodes 20s, 20d are formed. In any case, the gate electrode 20g and the source/drain electrodes 20s, 20d can be formed because the inorganic insulating layer 35 functions as a base material.

As shown in FIG. 2(d), a semiconductor layer 40 is then formed in contact with the source/drain electrodes 20s, 20d and on the gate electrode 20 with the inorganic insulating layer 35 interposed therebetween. The inorganic insulating layer 35 on the gate electrode 20g functions as a gate insulating film 30, and the semiconductor layer 40 between the source/drain electrodes 20s, 20d on the inorganic insulating layer 35 functions as a channel. The flexible semiconductor device 100 including a thin film transistor is thus completed.

The semiconductor layer 40 may be made of any material. However, since the semiconductor layer 40 functions as the channel of the thin film transistor, the semiconductor layer 40 is desirably made of a material having a large carrier mobility and a low contact resistance with the source/drain electrodes 20s, 20d. Either an inorganic semiconductor material or an organic semiconductor material may be used for the semiconductor layer 40.

As described above, in the present invention, the layered film of the three-layer clad, that is, the first metal layer 23 and the second metal layer 25 respectively formed on both surface of the inorganic insulating layer 35, is formed as a base structure. The first metal layer 23 and the second metal layer 25 are processed to form the gate electrode 20g and the source/drain electrodes 20s, 20d, and the semiconductor layer 40 is formed on the gate electrode 20g with the inorganic insulating layer 35 interposed therebetween. The thin film transistor can thus be easily formed without using a vacuum process.

Of the three-layer clad foil, the inorganic insulating layer 35 interposed between the first metal layer 23 and the second metal layer 25 functions as a base material. A flexible semiconductor device including a plurality of thin film transistors can therefore be easily formed.

In the present invention, the inorganic insulating layer 35 cannot be so thick because it functions as a gate insulating film. Therefore, the strength of the inorganic insulating layer 35 as a base material may not be ensured in the case where a large area flexible semiconductor device having a multiplicity of thin film transistors is formed. Moreover, in the case where a plurality of thin film transistors are formed, the gate insulating film 30 in each thin film transistor cannot be separated from each other because the inorganic insulating layer 35 is used as a base material. Accordingly, when thin film transistors are formed close to each other, leakage may occur between adjacent thin film transistors.

Figure 3:
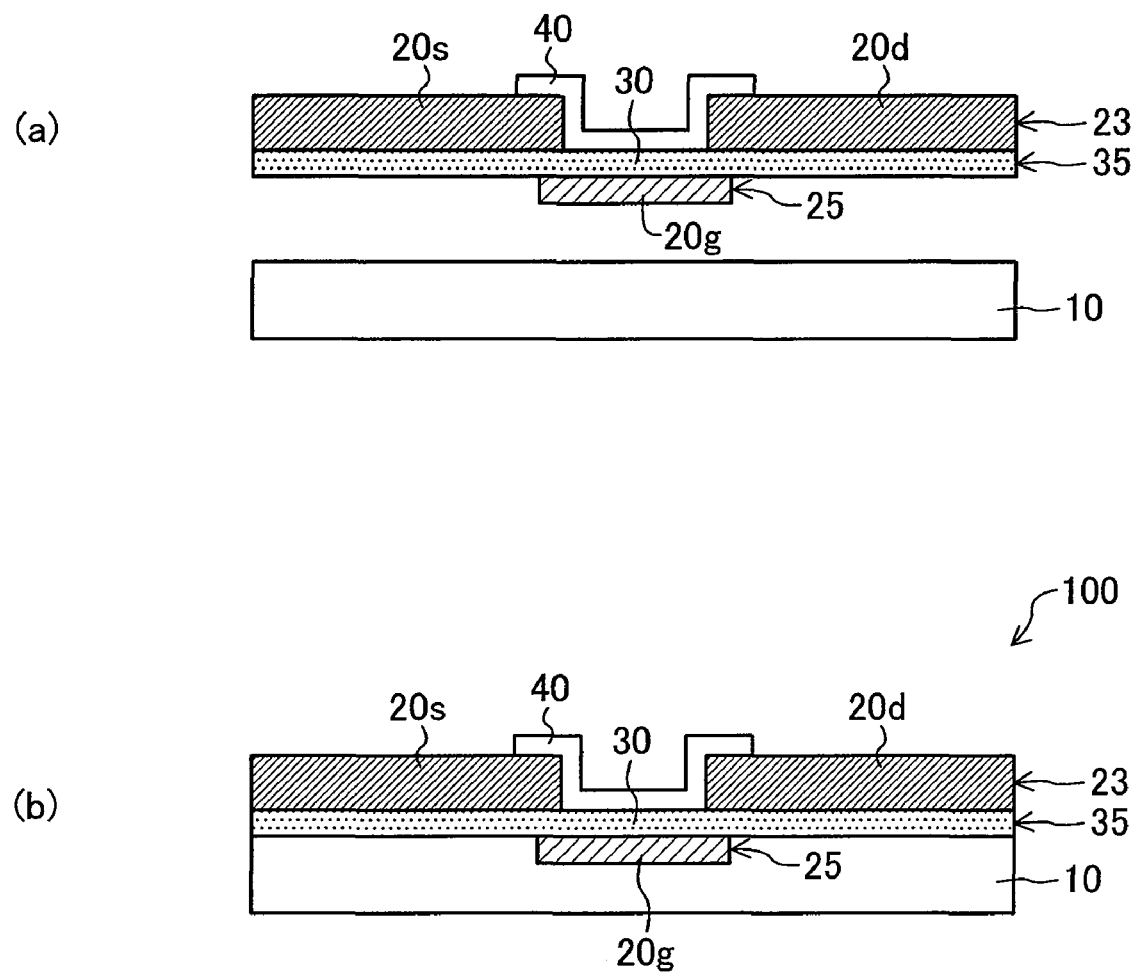
FIGS. 3(a) and 3(b) are cross-sectional views illustrating a manufacturing method of a flexible semiconductor device according to an embodiment of the present invention.

In this case, after the thin film transistors are formed by the above method as shown in FIG. 3(a), a resin film 10 is disposed on the gate electrode 20g side. As shown in FIG. 3(b), the gate electrode 20g is pressure-contacted to an upper surface of the resin film 10 so as to be embedded in the resin film 10. In this case, the resin film 10 having a larger thickness than that of the inorganic insulating layer 35 can be used as a base material instead of the inorganic insulating layer 35, whereby a large area flexible semiconductor device can be stably manufactured. Moreover, since only an inorganic material can be used up to the step of forming the semiconductor layer by using the layered film of the three-layer clad foil as a base structure, a high temperature process in which a resin film cannot be used can be used to form the semiconductor layer. As a result, a flexible semiconductor device can be manufactured by using an inorganic semiconductor having excellent characteristics.

The resin film 10 may be made of any material. However, the resin film 10 is preferably made of a material which is flexible enough to allow the gate electrode 20g to be embedded therein and at least a surface of which has an excellent adhesion property to the second metal layer 25 and the inorganic insulating layer 35.

Figure 4:
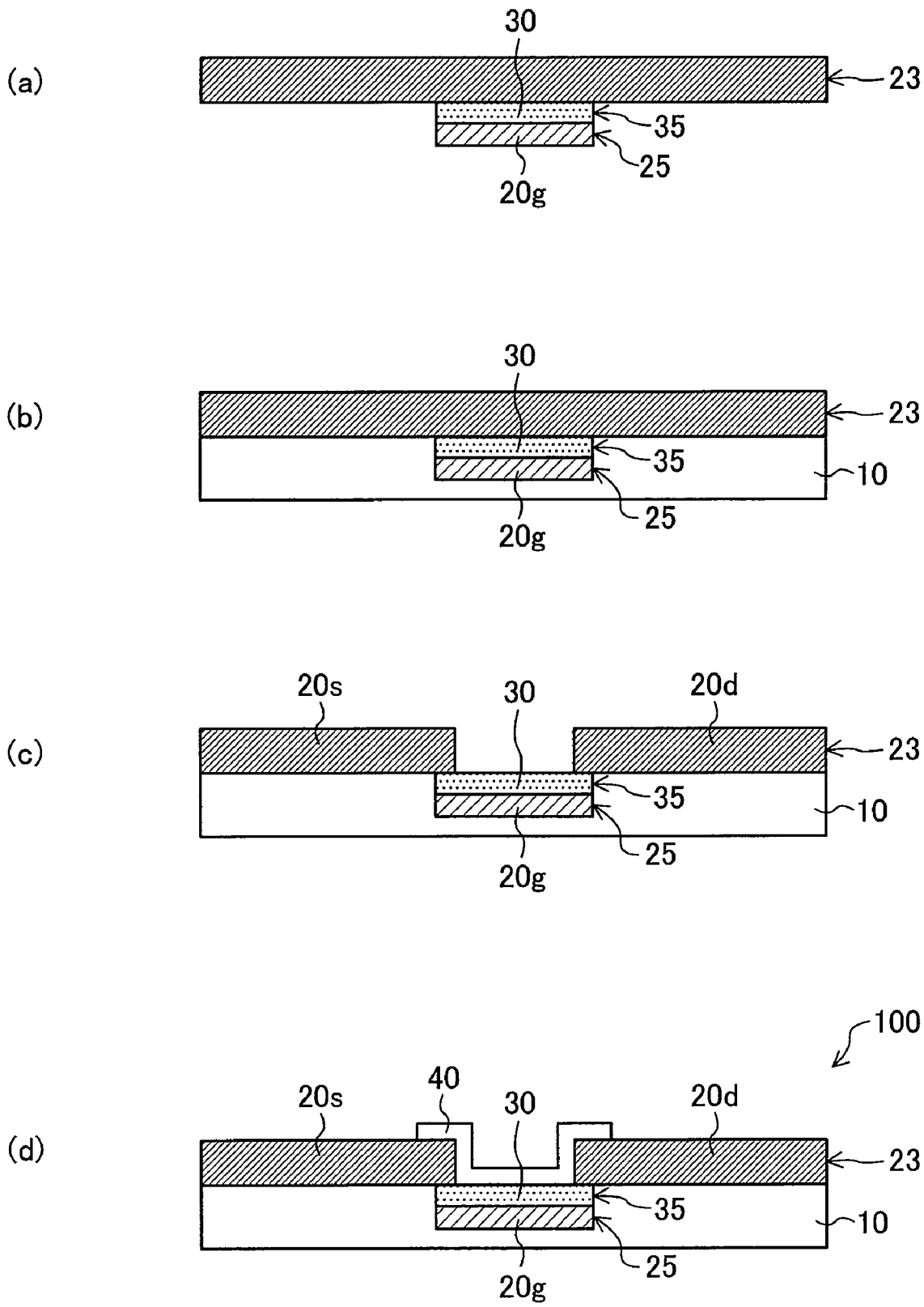
FIGS. 4(a) through 4(d) are cross-sectional views illustrating a manufacturing method of a flexible semiconductor device according to an embodiment of the present invention.

In order to suppress leakage between adjacent thin film transistors, the gate insulating film 30 may be separated by etching the inorganic insulating layer 35 simultaneously with forming the gate electrode 20g, as shown in FIG. 4(a). In this case, the inorganic insulating layer 35 loses its function as a base material. As shown in FIG. 4(b), however, a resin film 10 can be used as a base material instead of the inorganic insulating layer 35 by pressure-contacting the gate electrode 20g and the gate insulating film 30 on an upper surface of the resin film 10 so as to embed the gate electrode 20g and the gate insulating film 30 in the resin film 10.

As shown in FIGS. 4(c) and 4(d), by using the resin film 10 as a base material, the first metal layer 23 is etched to form source/drain electrodes 20s, 20d. A semiconductor layer 40 is then formed on the gate insulating film 30. A plurality of thin film transistors having the gate insulating film 30 separated from each other can thus be formed, whereby a flexible semiconductor device having reliable thin film transistors without leakage can be manufactured.

A third metal layer (not shown) may be formed on a lower surface of the resin film 10 serving as a base material. In this case, the lower surface of the resin film 10 can be used as a wiring region made of the third metal layer, thereby facilitating electrical connection between the plurality of thin film transistors formed on the upper surface of the resin film 10. More specifically, by forming a via in the resin film 10, the gate electrode 20g or/and the source/drain electrodes 20s, 20d of the thin film transistor can be electrically connected through the via to a wiring layer formed by etching the third metal film.

The inorganic insulating layer 35 of the present invention is a thin film having a high relative dielectric constant and can therefore function as a dielectric layer of a capacitor. In other words, when the second metal layer 25, the inorganic insulating layer 35, and the first metal layer 23 are processed to form the first gate electrode 20g, the gate insulating film 30, and the source/drain electrodes 20s, 20d, a capacitor can be formed simultaneously with the thin film transistor by forming a lower electrode, a dielectric layer, and an upper electrode.

Note that, in the above embodiment, the gate electrode 20g is pressure-contacted to the resin film 10 after formation of the gate electrode 20g so as to be embedded in the resin film 10. In the case where the source/drain electrodes 20s, 20d are formed before the gate electrode 20g, however, the source/drain electrodes 20s, 20d may be pressure-contacted to the resin film 10 after formation of the source/drain electrodes 20s, 20d so as to be embedded in the resin film 10. A so-called bottom-gate type thin film transistor is formed in the former case, and a so-called top-gate type thin film transistor is formed in the latter case.

Figure 5:
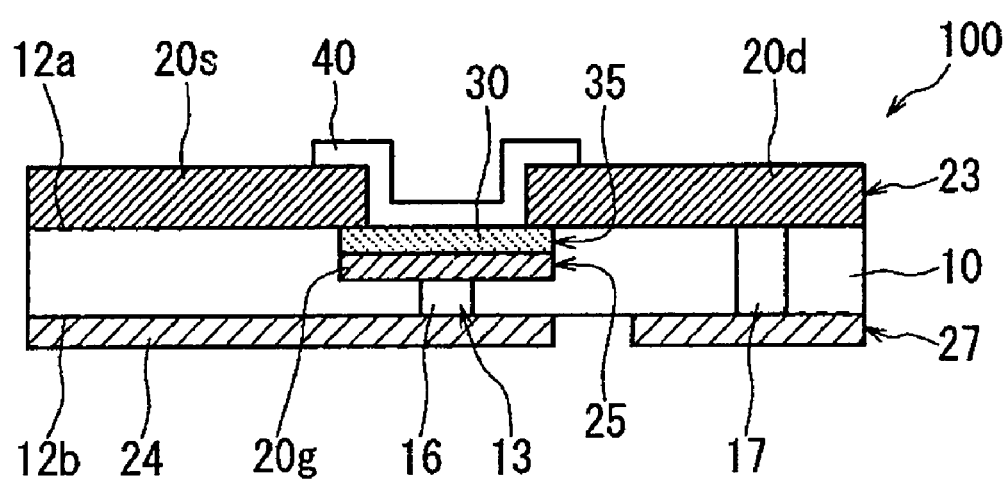
FIG. 5 is a cross-sectional view schematically showing an example of a flexible semiconductor device according to the embodiment.

Hereinafter, a specific structure of the flexible semiconductor device 100 according to the embodiment of the present invention will be described with reference to FIG. 5. Note that an example in which a thin film transistor is made of an organic semiconductor layer is described in the present embodiment. However, the present invention is not limited to this and is applicable also to a thin film transistor made of another semiconductor layer.

The flexible semiconductor device 100 is a flexible semiconductor device including a thin film transistor. As shown in FIG. 5, the flexible semiconductor device 100 includes a resin film 10, a second metal layer 25 embedded in the resin film 10 and functioning as a gate electrode 20g, an inorganic insulating layer 35 formed on an upper surface of the second metal layer 25 and functioning as a gate insulating film 30, and a first metal layer 23 formed on an upper surface 12a of the resin film 10 and functioning as a source electrode and a drain electrode. An organic semiconductor layer 40 containing an organic semiconductor is formed on the gate electrode 20g with the inorganic insulating layer 35 interposed therebetween. The organic semiconductor layer 40 is in contact with source/drain electrodes 20s, 20d.

In the present embodiment, a via 16 connecting to the second metal layer 25 embedded in the resin film 10 is formed in the resin film 10. In this embodiment, the via 16 is a so-called paste via and is made of a conductive paste that fills an opening 13 extending from the upper surface 12a to a lower surface 12b of the resin film 10. A third metal layer 27 including a gate line 24 is formed on the lower surface 12b of the resin film 10. The gate line 24 is electrically connected to the gate electrode 20g through the paste via 16.

By controlling an applied voltage to the gate electrode 20g to modulate the carrier amount accumulated at the interface, the amount of current flowing between the drain electrode 20d and the source electrode 20s is changed, whereby a switching operation can be performed.

Figure 6:
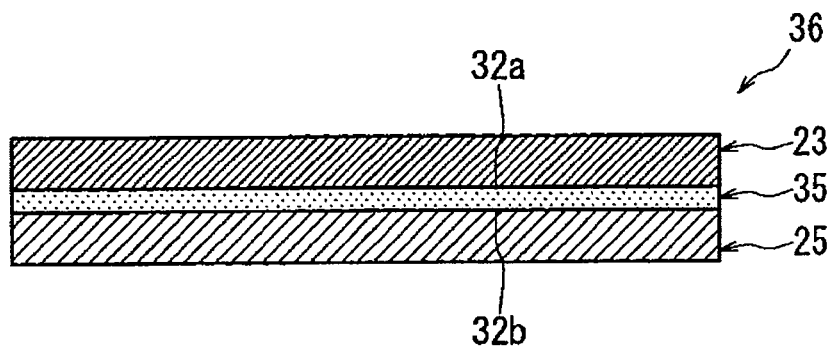
FIGS. 6(a) through 6(d) are cross-sectional views showing an example of a manufacturing process of a flexible semiconductor device according to the embodiment.
Figure 6:
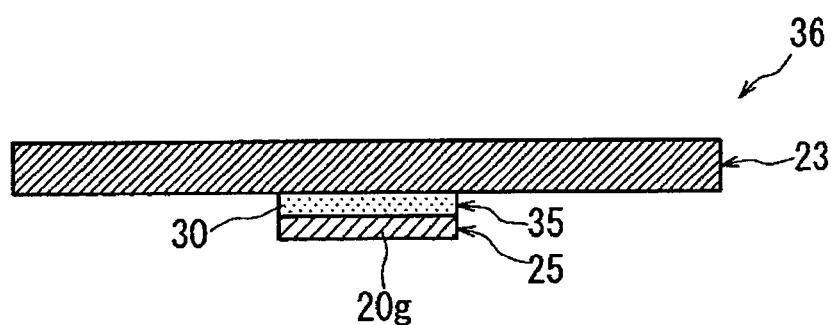
Figure 6:
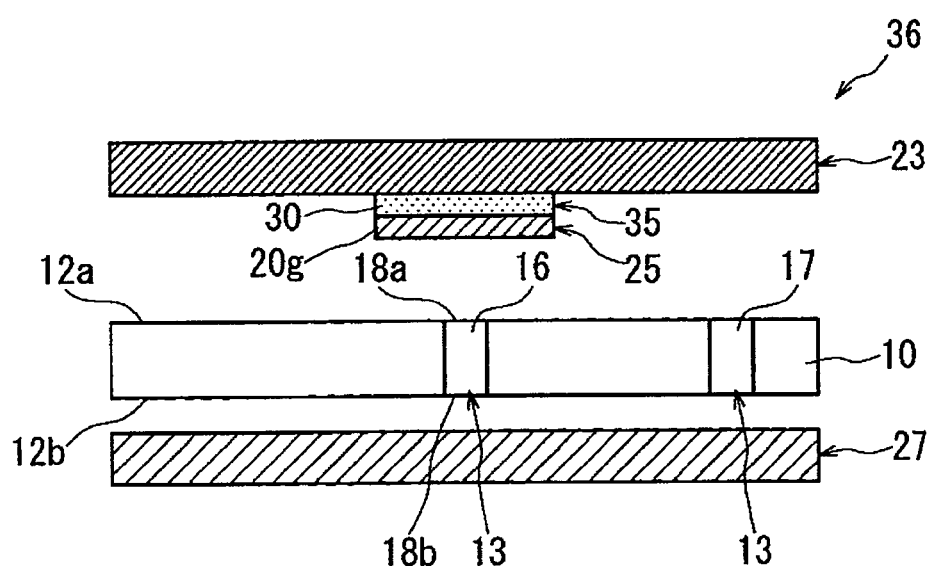
Figure 6:
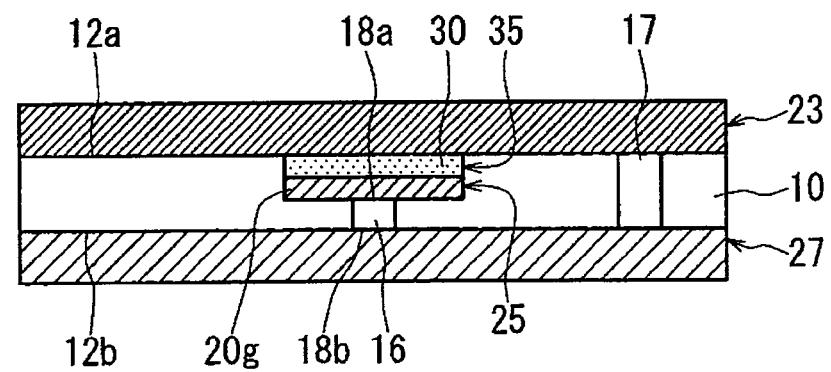
Figure 7:
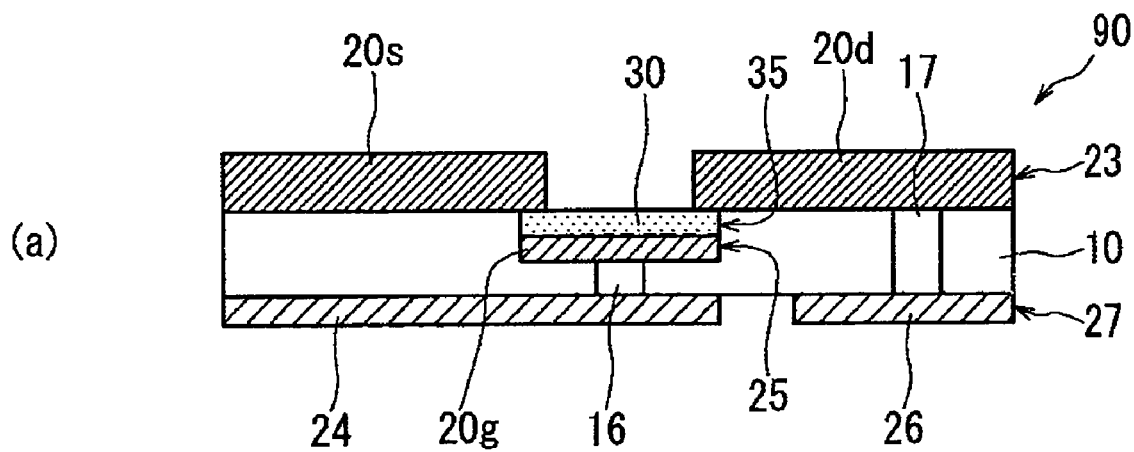
FIGS. 7(a) and 7(b) are cross-sectional views showing an example of a manufacturing process of a flexible semiconductor device according to the embodiment.
Figure 7:
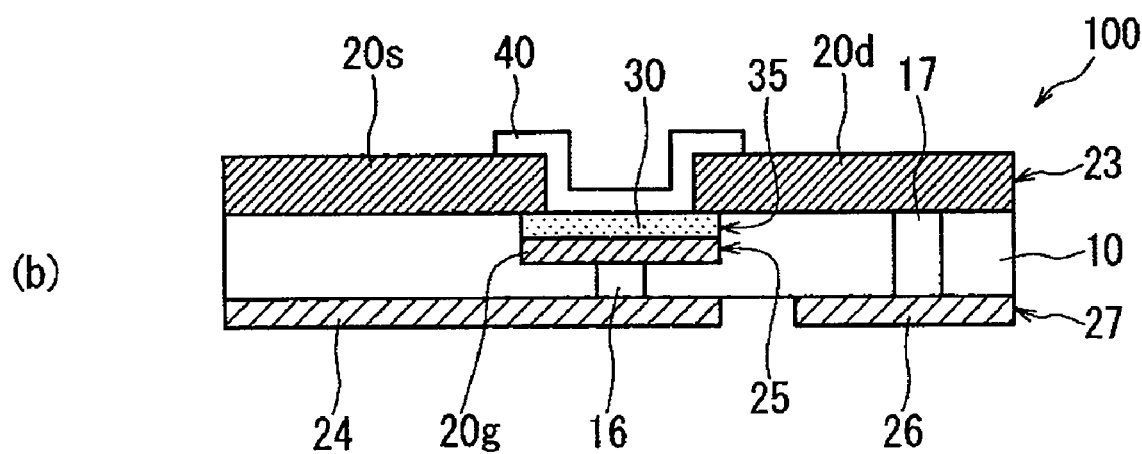

Hereinafter, a manufacturing method of the flexible semiconductor device 100 of the present embodiment will be described with reference to FIGS. 6 and 7. FIGS. 6 and 7 show cross-sectional views illustrating the manufacturing method of the flexible semiconductor device 100 of the present embodiment.

First, as shown in FIG. 6(a), a layered film 36 of a three-layered clad foil is prepared (e.g., fabricated). The three-layer clad foil is made of an inorganic insulating layer 35, a first metal layer 23, and a second metal layer 25.

The inorganic insulating layer 35 is made of an insulating inorganic compound. In the present embodiment, the inorganic insulating layer 35 is made of a tantalum oxide (e.g., $Ta_2O_5$). The thickness of the inorganic insulating layer 35 is, for example, 2 μm or less, and preferably 0.5 μm or less, and more preferably 0.1 μm or less.

The first metal layer 23 is formed on an upper surface 32a of the inorganic insulating layer 35. The first metal layer 23 is made of, for example, a metal foil (foil-like metal) and is made of a copper foil in the present embodiment. The thickness of the first metal layer 23 is, for example, 0.1 μm to 20 μm.

The second metal layer 25 is formed on a lower surface 32b of the first metal layer 23 which is opposite to the upper surface 32a. The second metal layer 25 is made of, for example, a metal foil (foil-like metal) and is made of a copper foil in the present embodiment. The thickness of the second metal layer 25 is, for example, 0.1 μm to 20 μm. The first metal layer 23 and the second metal layer 25 may be made of either the same metal or different metals.

As shown in FIG. 6(b), the second metal layer 25 is partially etched to form a gate electrode 20g. At this time, the inorganic insulating layer 35 formed on an upper surface of the second metal layer 25 may be etched. In the present embodiment, after the second metal layer 25 is partially etched to form the gate electrode 20g, the inorganic insulating layer 35 is etched to form a gate insulating film 30. In the case where the second metal layer 25 is made of a copper foil, ferric chloride, for example, can be used as an etchant for etching the second metal layer 25. In the case where the inorganic insulating layer 35 is made of a tantalum oxide, a hydrofluoric acid-nitric acid mixture, for example, can be used as an etchant for etching the inorganic insulating layer 35.

Next, a resin film 10 is prepared (e.g., manufactured or purchased) as shown in FIG. 6(c).

The resin film 10 is preferably made of a material having a high heat resistance and being flexible enough to allow the gate electrode 20g and the gate insulating film 30 to be embedded therein. Specific examples of such a resin material are an epoxy resin, a PPE resin, and a polyimide resin. The thickness of the resin film 10 is, for example, about 3 μm to about 100 μm.

At least a surface of the resin film 10 has an excellent adhesion property to the above metal layers 23, 27. The adhesion property at the resin film surface may be obtained by the material of the resin film 10 itself or by applying an adhesive to the surface of the resin film 10. For example, an epoxy resin, an acrylic resin, or a polyimide resin may be used as the adhesive to be applied to the surface of the resin film 10.

Note that the resin film 10 may be made of a resin material with small plastic deformation. For example, the resin film 10 may be made of a resin with small plastic deformation such as a polyimide resin or a polyethylene naphthalate (PEN) resin. In this case, a material that is flexible enough to allow the gate electrode 20g and the gate insulating film 30 to be embedded therein may be applied to a surface of the resin with small plastic deformation, and the resin having the material applied to the surface thereof can be used as the resin film 10.

Vias 16, 17 are formed in the resin film 10. In the present embodiment, two paste vias 16, 17 are formed in the resin film 10. The paste vias 16, 17 are made of a conductive paste that fills openings 13 extending from an upper surface 12a to a lower surface 12b of the resin film 10. A mixture of Ag-plated copper powder and a resin composition containing an epoxy resin as a main component may be used as the conductive paste.

A third metal layer 27 is prepared together with the resin film 10. The third metal layer 27 is made of, for example, a metal foil and is made of a copper foil in the present embodiment. The thickness of the third metal layer 27 is, for example, 0.1 μm to 20 μm.

As shown in FIG. 6(d), the layered film 36 is then pressure-contacted to the upper surface 12a of the resin film 10 so that the gate electrode 20g and the gate insulating film 30 are embedded in the resin film 10 and the top surface 12a of the resin film 10 is bonded to a lower surface of the first metal layer 23. In the pressure-contact process, the gate electrode 20g is positioned so as to be in contact with an upper surface 18a of the paste via 16. The gate electrode 20 is thus connected to the upper surface 18a of the paste via 16.

The third metal layer 27 is formed on the lower surface 12b of the resin film 10. In the present embodiment, the third metal layer 27 made of a copper foil is pressure-contacted to the lower surface 12b of the resin film 10 to bond the lower surface 12b of the resin film 10 to an upper surface of the third metal layer 27. At this time, the third metal layer 27 is pressure-contacted so as to be in contact with a lower surface 18b of the paste via 16. The third metal layer 27 is thus connected to the lower surface 18b of the paste via 16. Note that embedding of the gate electrode 20g in the resin film 10 and pressure-contacting of the third metal layer 27 to the resin film 10 may be simultaneously performed.

The gate electrode 20g and the third metal layer 27 are thus electrically connected to each other through the paste via 16. Note that, in the present embodiment, the resin film 10 further has the paste via 17, and the first metal layer 23 and the third metal layer 27 are electrically connected to each other through the paste via 17.

As shown in FIG. 7(a), the first metal layer 23 is then partially etched to form source/drain electrodes 20s, 20d. At this time, a wiring layer electrically connected to the source/drain electrodes 20s, 20d may be formed in addition to partially etching the first metal layer 23 to form the source/drain electrodes 20s, 20d.

The third metal layer 27 is also partially etched to form a gate line 24 that is electrically connected to the gate electrode 20g through the via 16. At this time, another wiring layer 26 may be formed together with the gate line 24. In the illustrated example, the wiring layer 26 formed together with the gate line 24 is electrically connected to the drain electrode 20d through the via 17. Note that, in the case where the first metal layer 23 and the third metal layer 27 are made of a copper foil, ferric chloride, for example, may be used as an etchant for etching the first metal layer 23 and the third metal layer 27. Etching of the first metal layer 23 and etching of the third metal layer 27 may be performed either simultaneously or separately depending on the formation conditions (e.g., the respective materials and thicknesses of the metal layers 23, 27).

A flexible semiconductor device assembly 90 that has a structure before an organic semiconductor is formed, that is, a flexible semiconductor device assembly 90 having the gate insulating film 30, the gate electrode 20g, and the source/drain electrodes 20s, 20d (hereinafter, sometimes collectively referred to as a "TFT structure"), is thus obtained. This flexile semiconductor device assembly 90 can be preferably used also as an evaluation TEG (Test-Element-Group).

Thereafter, as shown in FIG. 7(b), an organic semiconductor layer 40 is formed in contact with the source/drain electrodes 20s, 20d and on the gate electrode 20g with the gate insulating film 30 interposed therebetween.

In the present embodiment, the organic semiconductor layer 40 is supplied to the gap between the source/drain electrodes 20s, 20d and is formed so as to cover the respective end faces of the source/drain electrodes 20s, 20d and the upper surface of the gate insulating film 30. The organic semiconductor layer 40 can be formed by, for example, printing an organic semiconductor.

The flexible semiconductor device 100 of the present embodiment is thus formed. Note that a part of the source/drain electrodes 20s, 20d which is in contact with the organic semiconductor layer 40 may be plated with a noble metal. For example, the noble metal plating is gold plating. This can reduce the contact resistance between the source/drain electrodes 20s, 20d and the organic semiconductor layer 40.

The organic semiconductor layer 40 may be made of various organic semiconductors. An organic semiconductor having a high mobility is preferable, and an example of such an organic semiconductor is pentacene. The organic semiconductors are generally divided into the following types: a polymeric material (e.g., polythiophene or a derivative thereof), a low molecular material (e.g., pentacene and solubilized pentacene), a nano-carbon material (e.g., carbon nanotube, SiGe nanowire, fullerene, or modified fullerene), an inorganic-organic mixed material (e.g., a composite of $(C_6H_5C_2H_4NH_3)$ and $SnI_4$). Other examples of the organic semiconductor will be described later.

In the case where the organic semiconductor is a polymeric organic semiconductor (e.g., polythiophene or a derivative thereof), it is often preferable to form the organic semiconductor layer 40 by a printing process. In the case where the organic semiconductor is a low molecular organic semiconductor (e.g., pentacene), it is often preferable to form the organic semiconductor layer 40 by a vapor deposition process.

According to the manufacturing method of the flexible semiconductor device 100 of the present embodiment, the TFT structure can be formed in a simple manner by using the layered film 36 having the inorganic insulating layer 35, the first metal layer 23 formed on the upper surface 32a of the inorganic insulating layer 35, and the second metal layer 25 formed on the lower surface 32b facing the upper surface 32a. The flexible semiconductor device 100 including the gate insulating film 30 made of an inorganic insulating material having a higher dielectric constant than that of a polymeric film can be manufactured by a simple and easy process. Moreover, since the flexible semiconductor device 100 can be formed without using a vacuum process, a flexible semiconductor device having high productivity can be provided.

Figure 8:
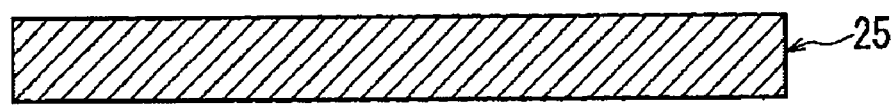
FIGS. 8(a) through 8(c) are cross-sectional views showing an example of a manufacturing process of a layered film according to the embodiment.
Figure 8:
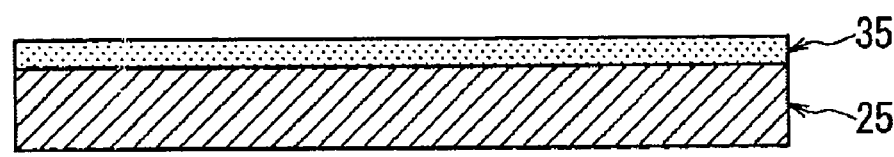
Figure 8:
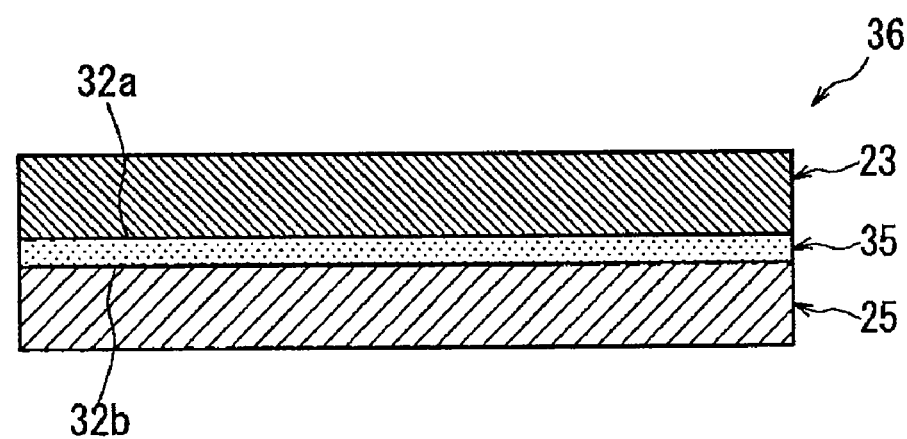

Moreover, although the inorganic insulating layer 35 is used, the flexible semiconductor device 100 can be manufactured by a low temperature process. More specifically, in the present embodiment, the inorganic insulating layer 35 is fabricated in advance by a high temperature process (typically, a part of a vacuum process such as thermal oxidation, a vacuum deposition method, a sputtering method, and a CVD method) as shown in FIGS. 8(a) through 8(c) described below, and a low temperature process is then performed by using the resin film 10. After the inorganic insulating layer 35 is prepared, it is therefore not necessary to introduce a high temperature process in the manufacturing process using the resin film 10. Although the inorganic insulating layer 35 is used, the manufacturing process can be performed by using the resin film 10 without using a glass substrate that can be resistant to a high temperature process. The flexible semiconductor device 100 can thus be manufactured in a simple and easy manner. Note that the inorganic insulating layer 35 need not necessarily be fabricated by the high temperature process described above, but may be fabricated by a low temperature process (e.g., a sol-gel method or a chemical synthesis method).

Note that the layered film 36 prepared in FIG. 6(a) (i.e., the layered film 36 used in the flexible semiconductor device 100 having an organic semiconductor) may be formed, for example, as shown in FIGS. 8(a) through 8(c).

First, a second metal layer 25 is prepared as shown in FIG. 8(a). The second metal layer 25 is, for example, a metal foil. The present invention is not limited to the metal foil, but a metal film deposited on a carrier film (e.g., a resin film such as PET) may be prepared. The use of the metal film deposited on the carrier film can reduce the thickness of the metal layer as compared to the case where only the foil is used. For example, the second metal layer 25 may be made of a metal such as copper, aluminum, or nickel. The second metal layer 25 may alternatively be made of an alloy of a plurality of metals.

As shown in FIG. 8(b), an inorganic insulating layer 35 is deposited (formed) on the second metal layer 25. Deposition of the inorganic insulating layer 35 is performed by, for example, a high temperature process such as a vacuum deposition method (e.g., a laser ablation method), a sputtering method, or a CVD (Chemical Vapor Deposition) method (e.g., a plasma enhanced CVD method). The laser ablation method is preferable in that a film can be formed with a small change in composition of an inorganic compound. The CVD method is preferable in that deposition of an inorganic insulating layer is easy, synthesis of a multi-component film is possible, and a high dielectric constant film can be formed. Other methods such as a sol-gel method and a chemical synthesis method can also be preferably used as a method for forming the inorganic insulating layer.

The inorganic insulating layer 35 is preferably made of an insulating inorganic compound having a high relative dielectric constant. The relative dielectric constant is 8 or higher, and preferably 25 or higher. Examples of such an inorganic compound are a titanium oxide ($TiO_2$ with a relative dielectric constant of about 100), a tantalum oxide ($Ta_2O_5$ with a relative dielectric constant of about 25), an aluminum oxide ($Al_2O_3$ with a relative dielectric constant of about 8), and a niobium oxide ($Nb_2O_5$). A mixture of a plurality of inorganic compounds may be used.

As shown in FIG. 8(c), a first metal layer 23 is formed on the insulating organic layer 35. The first metal layer 23 may be formed by deposing a metal on the inorganic insulating layer 35. For example, a vacuum deposition method or a sputtering method can be preferably used as a deposition method of the first metal layer 23. The first metal layer 23 is made of, for example, copper, aluminum, nickel, or the like. The first metal layer 23 may alternatively be made of an alloy of a plurality of metals.

A layered film (three-layer clad foil) 36 made of the following three layers can thus be formed in a preferable manner: the inorganic insulating layer 35 for the gate insulating film 30; the first metal layer 23 for the source/drain electrodes 20s, 20d as a metal layer formed on the upper surface 32a of the inorganic insulating layer 35; and the second metal layer 25 for the gate electrode 20g as a metal layer formed on the lower surface 32b facing the upper surface 32a of the inorganic insulating layer 35.

Figure 9:
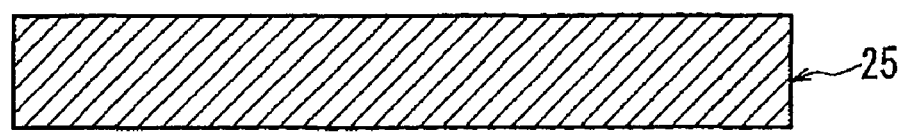
FIGS. 9(a) through 9(c) are cross-sectional views showing a modification of a manufacturing process of a layered film according to the embodiment.
Figure 9:
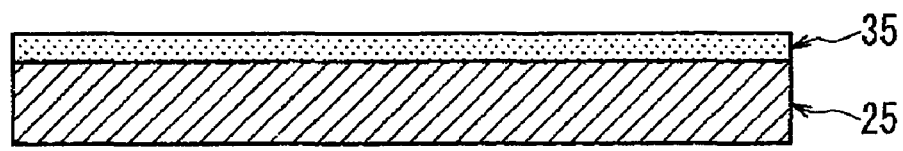
Figure 9:
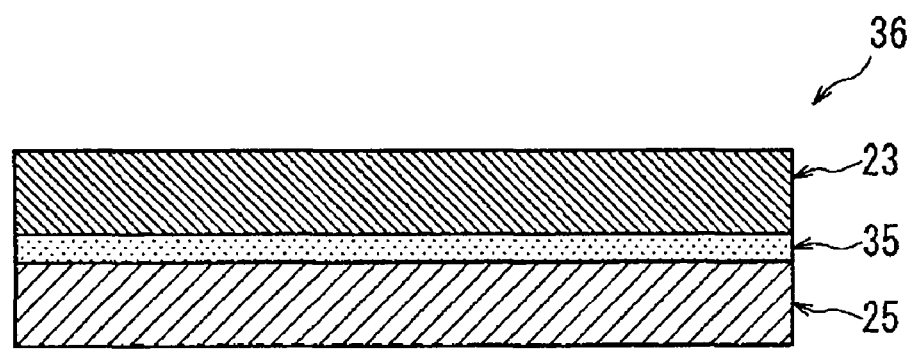

The layered film 36 prepared in FIG. 6(a) may alternatively be formed, for example, as shown in FIGS. 9(a) through 9(c). The modification shown in FIGS. 9(a) through 9(c) is different from the above embodiment of FIGS. 8(a) through 8(c) in that the inorganic insulating layer 35 is made of a metal oxide film of a metal used for the second metal layer 25.

First, the second metal layer 25 is prepared as shown in FIG. 9(a). The second metal layer 25 is, for example, a metal foil. The present invention is not limited to the metal foil, but a metal film deposited on a carrier film (e.g., a resin film such as PET) may be prepared. The use of the metal film deposited on the carrier film can reduce the thickness of the metal layer as compared to the case where only the foil is used. Moreover, since one surface of the metal layer is covered with the carrier film, the surface that is not covered with the carrier film can be selectively oxidized. A surface oxidization process of the second metal layer 25 described below can thus be performed in a simple manner. Note that the thickness of the second metal layer 25 is, for example, 0.1 μm to 20 μm.

As shown in FIG. 9(b), a metal oxide film 35 is then formed by oxidizing an upper surface of the second metal layer 25. The metal oxide film 35 will function as a gate insulating film. The oxidization process of the second metal layer 25 is performed by, for example, an anodization method, a thermal oxidation method (surface oxidation process by heating), or a chemical oxidation method (surface oxidation process by an oxidizing agent).

The second metal layer 25 may be made of any metal that can be oxidized by the above oxidizing process, and is not limited to a specific metal. However, the second metal layer 25 is preferably made of a valve metal (e.g., aluminum or tantalum). In the case of a valve metal, an anodization method can be used and an oxide coating film can be formed in a simple manner on the metal surface. For example, in the case where the second metal layer 25 is made of an aluminum foil, a metal oxide film 35 made of aluminum oxide ($Al_2O_3$) can be formed in a simple manner on the surface of the second metal layer 25 by anodization. The smaller the thickness of this metal oxide film 35 is, the more preferable in order to reduce the gate voltage. For example, the thickness of the metal oxide film 35 thus formed is 2 μm or less, and more preferably 0.6 μm or less. The thickness of the metal oxide film 35 can be arbitrarily adjusted by appropriately changing the formation conditions of the metal oxide film (typically, the oxidization process conditions such as a processing temperature and processing time).

As shown in FIG. 9(c), a first metal layer 23 is then formed on the metal oxide film 35. The first metal layer 23 can be formed by depositing a metal on the metal oxide film 35. For example, a vacuum deposition method or a sputtering method can be preferably used as a deposition method of the first metal layer 23. The first metal layer 23 may be made of, for example, copper, aluminum, nickel, or the like. The first metal layer 23 may alternatively be made of an alloy of a plurality of metals.

A layered film (three-layer clad foil) 36 made of the following three layers can thus be formed in a preferable manner: the metal oxide film 35 for the gate insulating film 30; the first metal layer 23 for the source/drain electrodes 20s, 20d as a metal layer formed on the upper surface 32a of the metal oxide film 35; and the second metal layer 25 for the gate electrode 20g as a metal layer formed on the lower surface 32b facing the upper surface 32a of the metal oxide film 35.

Since the metal oxide film 35 functioning as the gate insulating film 30 is thus formed by surface-oxidizing the second metal layer 25, the thickness of the gate insulating film 30 can reduced, whereby the gate voltage can be reduced. As a result, characteristics of the flexible semiconductor device 100 can be improved. Especially by using an anodization process, the thickness of the metal oxide film can be adjusted on the nanometer order, and the thin gate insulating film 30 can be formed in a simple manner.

Note that, in the case where an anodization method is used, the metal oxide film 36 may be made of a metal oxide such as a tantalum oxide ($Ta_2O_5$), an aluminum oxide ($Al_2O_3$), a niobium oxide ($Nb_2O_5$), a hafnium oxide ($HfO_2$), a zirconium oxide ($ZrO_2$), a titanium oxide ($TiO_2$), or the like. In the case where an oxidization method other than the anodization method is used, the metal oxide film 36 may be made of a metal oxide such as an yttrium oxide ($Y_2O_3$), a titanium composite oxide (such as $BaTiO_3$ and $SrTiO_3$), or the like.

Hereinafter, another manufacturing method of the flexible semiconductor device of the present embodiment will be described with reference to FIGS. 10(a) through 10(d) and FIGS. 11(a) through 11(d). This example is different from the above embodiment in that the vias 16, 17 formed in the resin film 10 are plating vias instead of the paste vias. The plating via 16 is formed after formation of the third metal layer 27.

Figure 10:
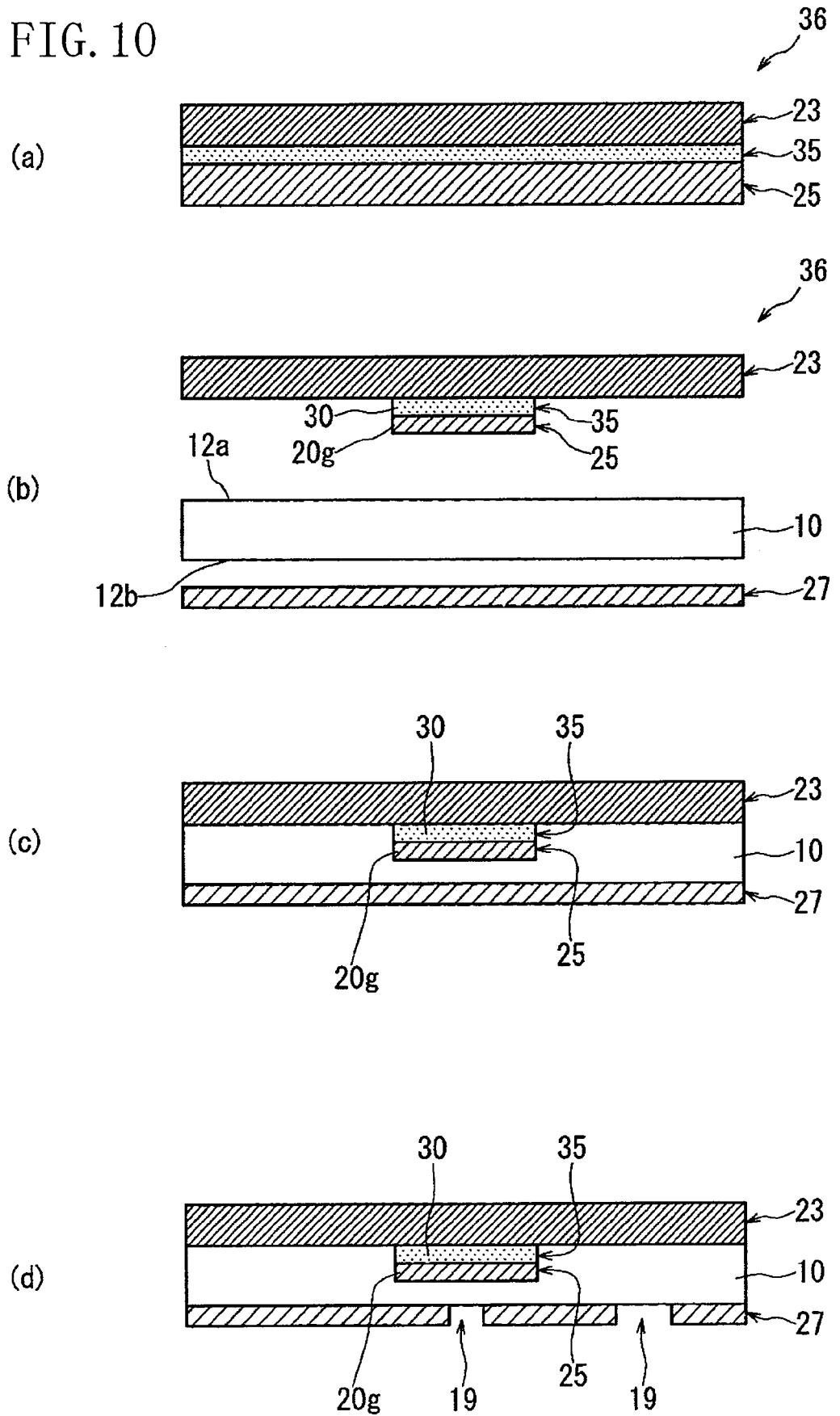
FIGS. 10(a) through 10(d) are cross-sectional views showing a modification of a manufacturing process of a flexible semiconductor device according to the embodiment.

First, as shown in FIG. 10(a), a layered film 36 made of three layers, that is, an inorganic insulating layer 35, a first metal layer 23, and a second metal layer 25, is prepared. The layered film 36 prepared herein is a layered film 36 formed by, for example, the fabrication process of FIGS. 8(a) through 8(c) or FIGS. 9(a) through 9(c).

As shown in FIG. 10(b), the second metal layer 25 is partially etched to form a gate electrode 20g. In the present embodiment, after the gate electrode 20g is formed, the inorganic insulating layer 35 is etched to form a gate insulating film 30. A resin film 10 and a third metal layer 27 are then prepared.

As shown in FIG. 10(c), the layered film 36, the resin film 10, and the third metal layer 27 are then laminated together. At this time, the gate electrode 20g is embedded together with the gate insulating film 30 in an upper surface 12a of the resin film 10. The resin film 10 and the first metal layer 23 are thus bonded to each other. Moreover, the third metal layer 27 is bonded to a lower surface 12b of the resin film 10.

As shown in FIG. 10(d), the third metal layer 27 is then partially etched to form laser irradiation holes 19. The laser irradiation holes 19 function as a guide wall during laser irradiation described below. As shown in FIG. 11(a), openings 13 are then formed in the resin film 10. Formation of the openings 13 is performed by applying laser beams by using the laser irradiation holes 19 as a guide wall.

As shown in FIG. 11(b), a meal plating process is then performed in the openings 13 of the resin film 10 to form plating vias 16, 17. In the present embodiment, copper plating vias 16, 17 are formed by using a conformal method. More specifically, an electroless copper plating process is performed to form a thin copper layer over the resin film 10 including the openings 13. A copper electroplating process is then performed to increase the thickness of the copper layer, thereby forming copper plating. The copper plating is formed so as to cover the lower surface of the third metal layer 27, the wall surface of the opening 13, and the lower surface of the gate electrode 20g, thereby forming the plating via 16 electrically connecting the gate electrode 20g and the third metal layer 27 to each other. In the present embodiment, the copper plating is also formed so as to cover the lower surface of the third metal layer 27, the wall surface of the opening 13, and the lower surface of the first metal layer 23, thereby forming the plating via 17 electrically connecting the first metal layer 23 and the third metal layer 27 to each other.

As shown in FIG. 11(c), the first metal layer 23 is partially etched to form source/drain electrodes 20s, 20d. The third metal layer 27 is partially etched to form a gate line 24. The gate line 24 is electrically connected to the gate electrode 20g through the via 16.

A flexible semiconductor device assembly 90 that has a structure before an organic semiconductor is formed, that is, a flexible semiconductor device assembly 90 having a TFT structure (the gate insulating film 30, the gate electrode 20g, and the source/drain electrodes 20s, 20d), is thus obtained.

Thereafter, as shown in FIG. 11(d), an organic semiconductor layer 40 is formed in contact with the source/drain electrodes 20s, 20d and on the gate electrode 20g with the gate insulating film 30 interposed therebetween. A flexible semiconductor device 100 is thus obtained.

According to the above manufacturing method of the flexible semiconductor device, connection between the gate electrode 20g and the via can be easily implemented. In other words, in the case of the connection between the gate electrode 20g and the paste via, the gate electrode 20g needs to be positioned so as to be in contact with the paste via 16 in the pressure-contact process for embedding the gate electrode 20g in the resin film 10 as shown in FIG. 6(*d*). High positioning accuracy between the gate electrode 20g and the resin film 10 is therefore required.

Figure 11:
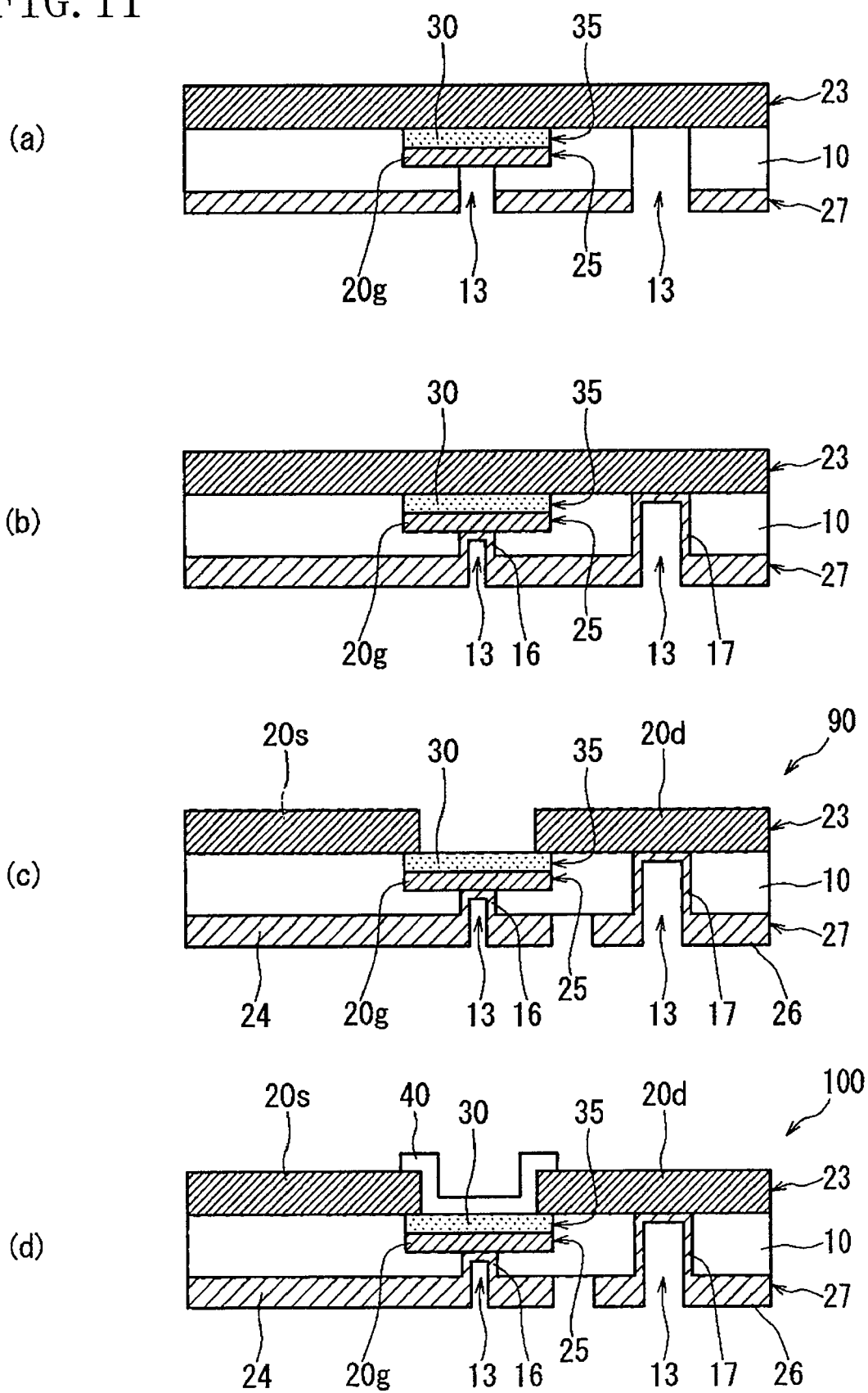
FIGS. 11(a) through 11(d) are cross-sectional views showing a modification of a manufacturing process of a flexible semiconductor device according to the embodiment.

In the case of the connection between the gate electrode 20g and the plating via 16, on the other hand, the plating via 16 is formed after the gate electrode 20g is embedded in the resin film 10 as shown in FIGS. 11(*a*) and 11(*b*). High positioning accuracy between the gate electrode 20g and the resin film 10 is therefore not required. Accordingly, the flexible semiconductor device 100 can be manufactured in a simple manner.

Formation of the third metal layer 27 and formation of the plating vias 16, 17 may be performed simultaneously. This will now be described with reference to FIGS. 12(*a*) through 12(*d*) and FIGS. 13(*a*) through 13(*e*).

Figure 12:
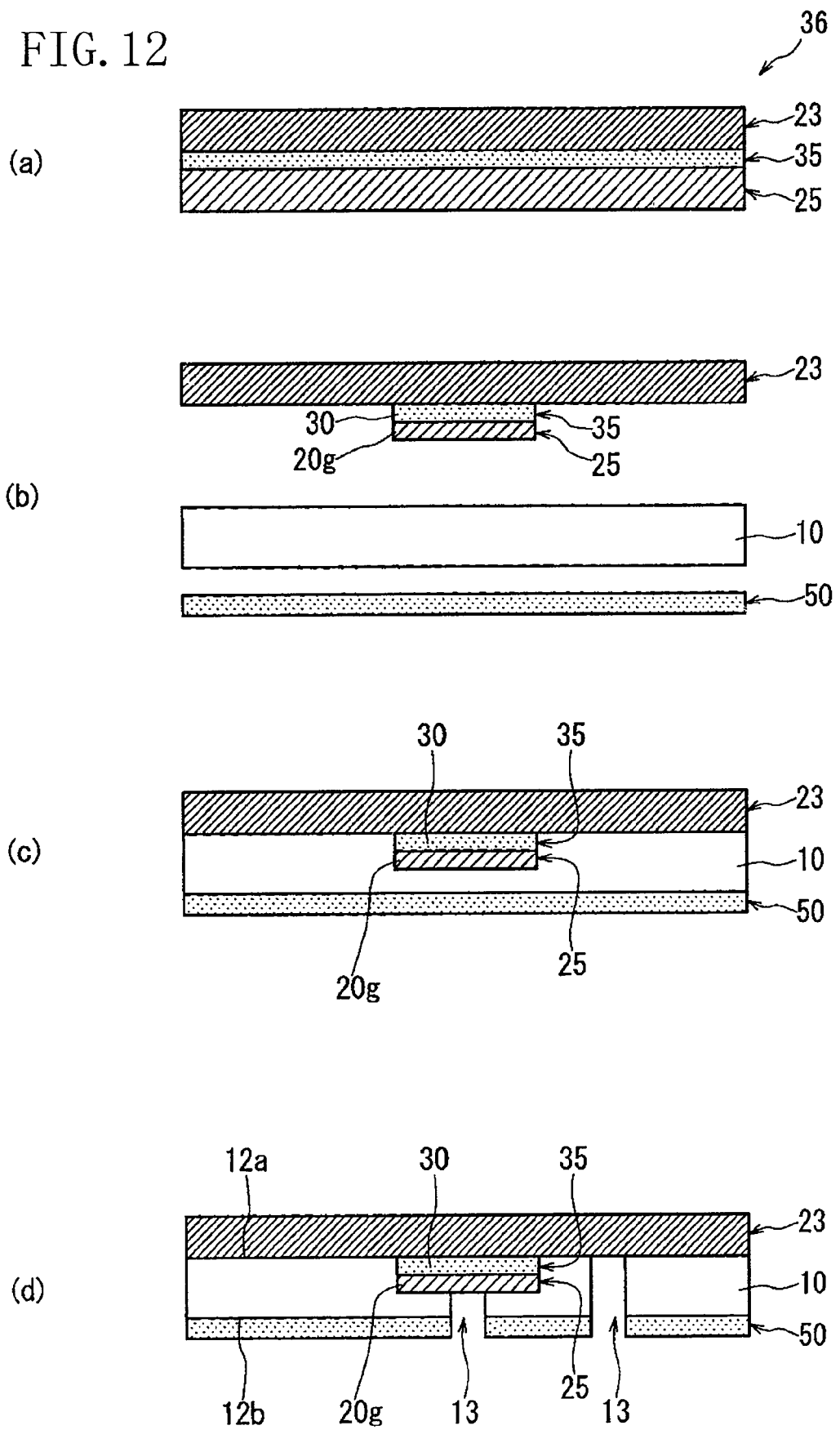
FIGS. 12(a) through 12(d) are cross-sectional views showing a modification of a manufacturing process of a flexible semiconductor device according to the embodiment.

First, a layered film 36 made of three layers, that is, an inorganic insulating layer 35, a first metal layer 23, and a second metal layer 25, is prepared as shown in FIG. 12(*a*). The layered film 36 prepared herein is a layered film 36 formed by, for example, the fabrication process shown in FIGS. 8(*a*) through 8(*c*) or FIGS. 9(*a*) through 9(*c*).

As shown in FIG. 12(*b*), the second metal layer 25 is partially etched to form a gate electrode 20g. In the present embodiment, after the gate electrode 20g is formed, the inorganic insulating layer 35 is etched to form a gate insulating film 30. A resin film 10 and a protective film 50 are then prepared. The protective film 50 is made of, for example, a resin film such as PET or PEN.

As shown in FIG. 12(*c*), the layered film 36, the resin film 10, and the protective film 50 are then laminated together. At this time, the gate electrode 20g is embedded together with the gate insulating film 30 in an upper surface 12a of the resin film 10. The resin film 10 and the first metal layer 23 are thus bonded to each other. Moreover, the protective film 50 is bonded to a lower surface 12b of the resin film 10. In this process, the protective film 50 and the resin film 10 are separately prepared and then laminated together. However, the resin film 10 having the protective film 50 bonded thereto may be prepared.

As shown in FIG. 12(*d*), openings 13 are then formed in the resin film 10.

Formation of the openings 13 is performed by, for example, applying laser beams to the resin film 10 through the protective film 50. The protective film 50 is then peeled from the resin film 10 to expose the lower surface 12b of the resin film 10.

Figure 13:
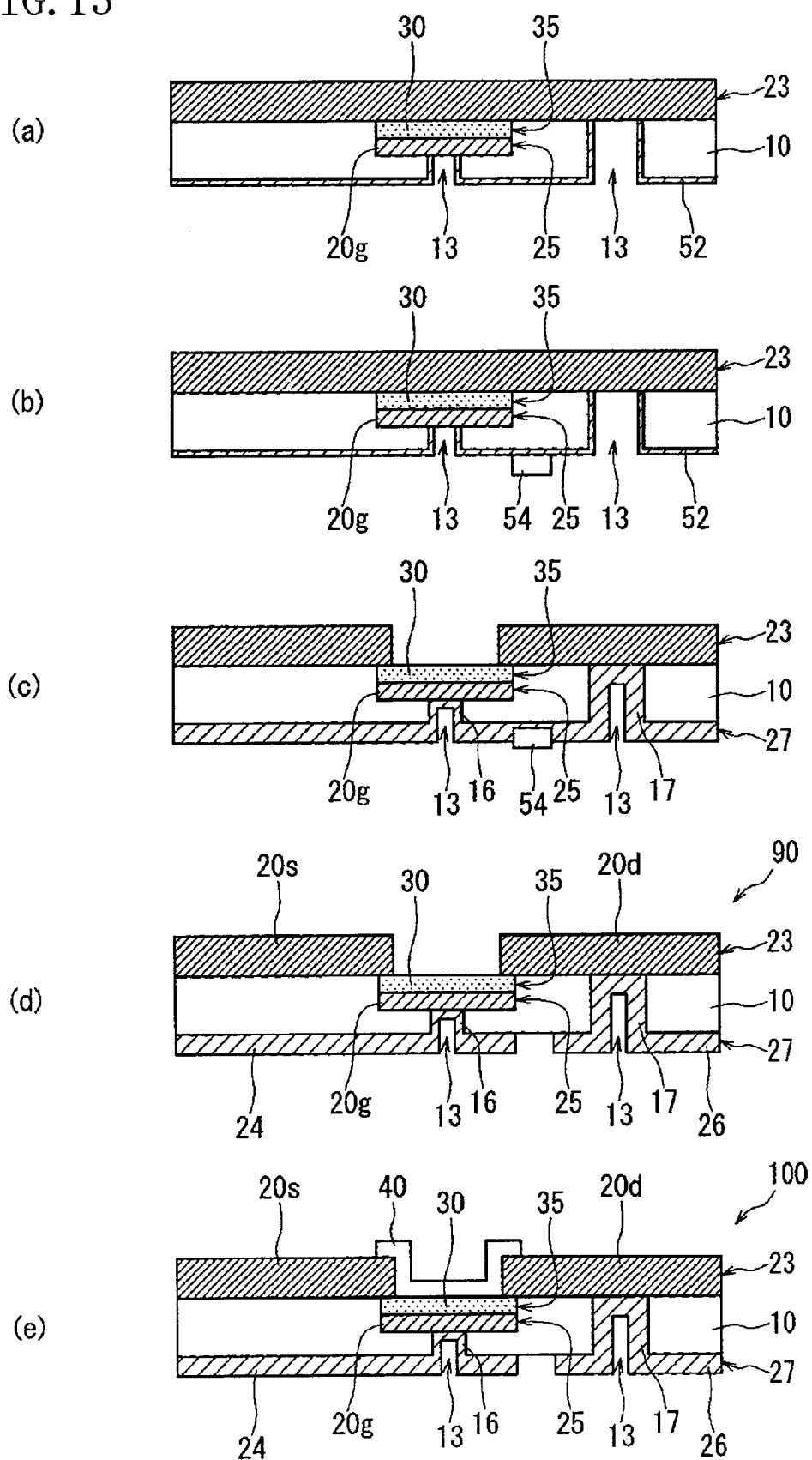
FIGS. 13(a) through 13(e) are cross-sectional views showing a modification of a manufacturing process of a flexible semiconductor device according to the embodiment.

As shown in FIG. 13(*a*), an electroless copper plating process is then performed on the lower surface 12b of the resin film 10 including the openings 13 to form a thin copper layer 52.

As shown in FIG. 13(*b*), a resist 54 is then formed at a predetermined position on the copper layer 52. As shown in FIG. 13(*c*), an electroless copper plating process is then performed to increase the thickness of the copper layer 52, thereby forming copper plating.

The copper plating is formed on the lower surface 12b of the resin film 10 except for the region masked by the resist 54. The copper plating thus forms a third metal layer 27. The copper plating is also formed so as to cover the wall surface of the opening 13 and the lower surface of the gate electrode 20g, thereby forming a plating via 16 connecting the gate electrode 20g and the third metal layer 27 to each other. In the present embodiment, the copper plating is also formed so as to cover the wall surface of the opening 13 and the lower surface of the first metal layer 23, thereby forming a plating via 17 connecting the first metal layer 23 and the third metal layer 27 to each other. Formation of the third metal layer 27 and formation of the plating vias 16, 17 can thus be performed simultaneously.

The resist 54 formed over the lower surface 12b of the resin film is then removed as shown in FIG. 13(*d*). Slice etching is then performed to remove the copper layer 52 formed under the resist 54, thereby forming a gate line 24 electrically connected to the gate electrode 20g through the via 16. The first metal layer 23 is also partially etched to form source/drain electrodes 20s, 20d.

A flexible semiconductor device assembly 90 that has a structure before an organic semiconductor is formed, that is, a flexible semiconductor device assembly 90 having a TFT structure (the gate insulating film 30, the gate electrode 20g, and the source/drain electrodes 20s, 20d), is thus obtained.

Thereafter, as shown in FIG. 13(*e*), an organic semiconductor layer 40 is formed in contact with the source/drain electrodes 20s, 20d and on the gate electrode 20g with the gate insulating film 30 interposed therebetween. A flexible semiconductor device 100 is thus obtained.

According to the above manufacturing method, the third metal layer 27 for the gate line 24, the plating via 16 connecting the gate electrode 20g and the third metal layer 27 to each other, and the plating via 17 connecting the first metal layer 23 and the third metal layer 27 to each other can be formed simultaneously.

Figure 14:
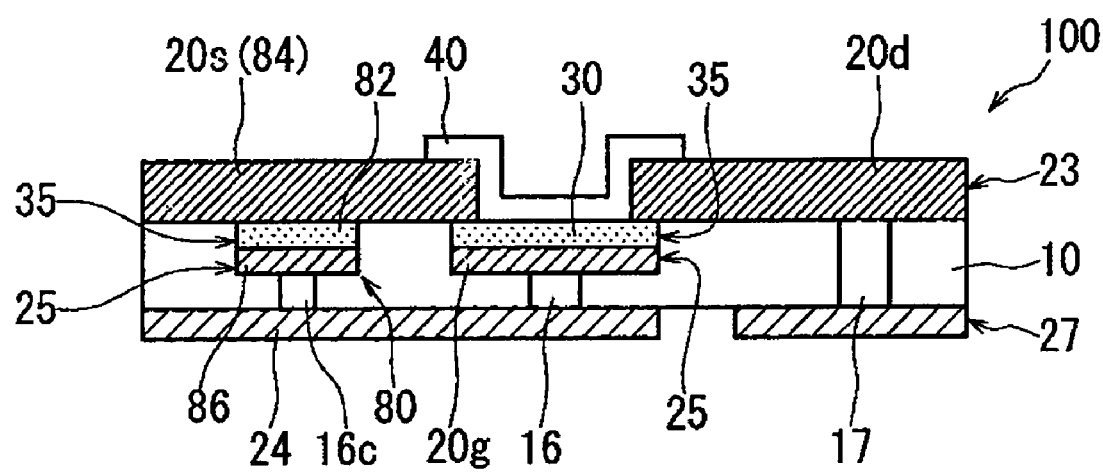
FIG. 14 is a cross-sectional view schematically showing a modification of a flexible semiconductor device according to the embodiment.

As shown in FIG. 14, the flexible semiconductor device 100 may include a capacitor 80 in the resin film 10. In this case, a dielectric layer 82 of the capacitor 80 can be made of the inorganic insulating layer 35 (i.e., a layer made of the same insulating material as that of the gate insulating film 30 and located in the same layer as that of the gate insulating film 30). An upper electrode layer 84 and a lower electrode layer 86 of the capacitor 80 can be respectively made of the same metal material as that of the first metal layer 23 (i.e., a layer made of the same metal material as that of the source/drain electrodes 20s, 20d and located in the same layer as that of the source/drain electrodes 20s, 20d) and the second metal layer 25 (i.e., a layer made of the same metal material as that of the gate electrode 20g and located in the same layer as that of the gate electrode 20g). In the present embodiment, the upper electrode layer 84 is formed by the source electrode 20s of the first metal layer 23. The lower electrode layer 86 is formed by the second metal layer 25 that is different from the gate electrode 20g. The lower electrode layer 86 is connected to the gate line 24 of the third metal layer 27 through a via 16c.

Driving a display is an important application of the flexible semiconductor device. An active matrix element for driving a display requires a capacitor for holding a capacitance to drive the element. Providing the capacitor 80 inside the resin film as described above eliminates the need to separately provide a capacitor outside the flexible semiconductor device. As a result, a small flexible semiconductor device 100 capable of high-density mounting can be provided.

Since the dielectric layer 82 is the same layer as that of the gate insulating film 30, the upper electrode layer 84 is the same layer as that of the source/drain electrodes 20s, 20d, and the lower electrode layer 86 is the same layer as that of the gate electrode 20g, the capacitor 80 can be fabricated in a simple and easy manner. More specifically, the flexible semiconductor device 100 having the capacitor 80 can be manufactured as described below.

Figure 15:
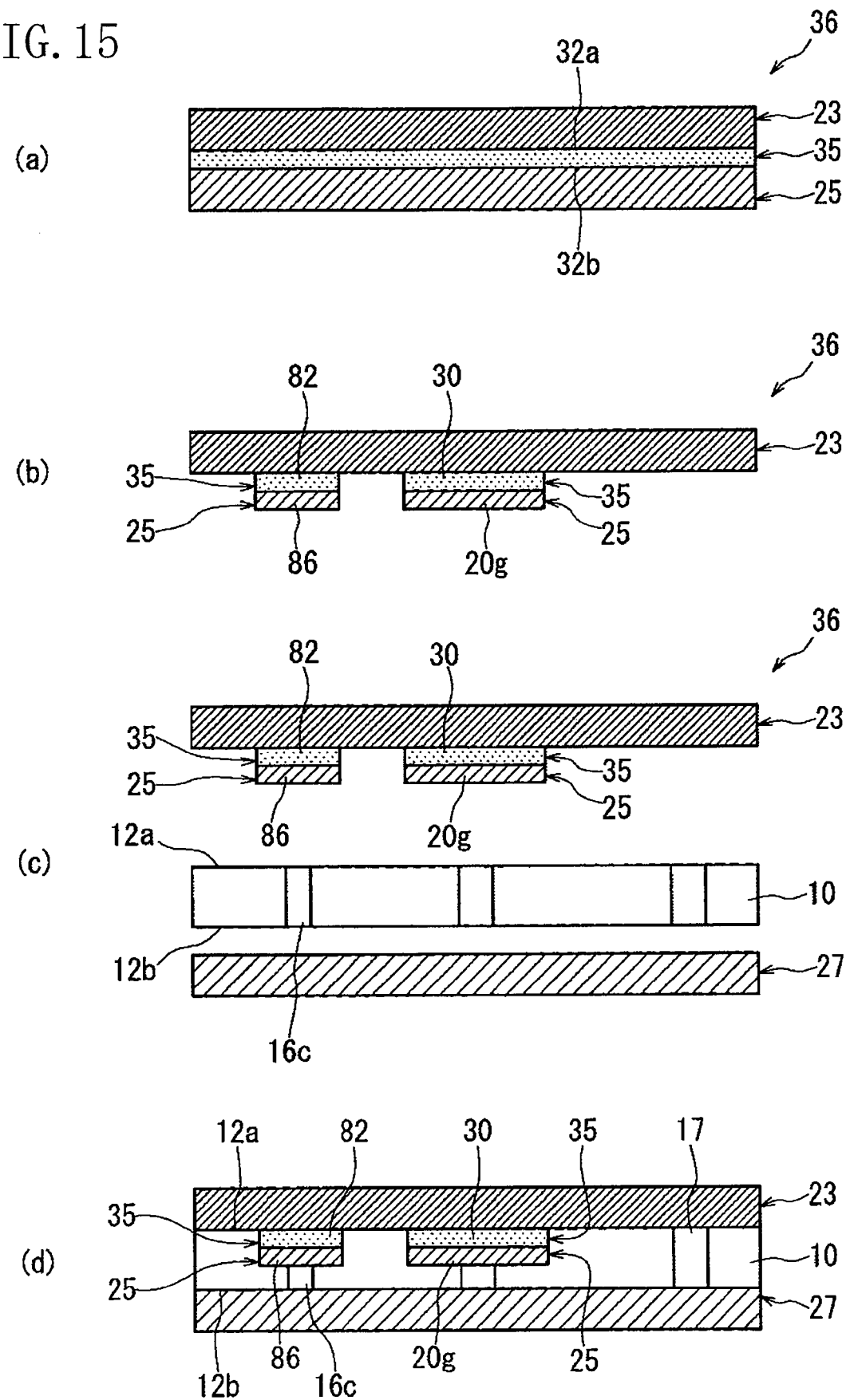
FIGS. 15(a) through 15(d) are cross-sectional views showing a modification of a manufacturing process of a flexible semiconductor device according to the embodiment.

A layered film 36 made of three layers, that is, an inorganic insulating layer 35, a first metal layer 23, and a second metal layer 25, is first prepared as shown in FIG. 15(*a*). The layered film 36 prepared herein is a layered film 36 formed by, for example, the fabrication process shown in FIGS. 8(a) through 8(c) or FIGS. 9(a) through 9(c).

As shown in FIG. 15(b), the second metal layer 25 is then partially etched to form a gate electrode 20g and a lower electrode layer 86 of a capacitor. The inorganic insulating layer 35 is also partially etched to form a gate insulating film 30 and a dielectric layer 82 of the capacitor.

As shown in FIG. 15(c), a resin film 10 having a paste via 16c and a third metal layer 27 are then prepared. As shown in FIG. 15(d), the lower electrode layer 86 is then embedded together with the gate electrode 20g in an upper surface 12a of the resin film 10 by a pressure-contact process. At this time, the lower electrode layer 86 is pressure-contacted so as to be in contact with an upper surface of the paste via 16c, and is connected to the paste via 16c. The third metal layer 27 is pressure-contacted to a lower surface 12b of the resin film 10, whereby the third metal layer 27 is connected to a lower surface of the paste via 16c.

Figure 16:
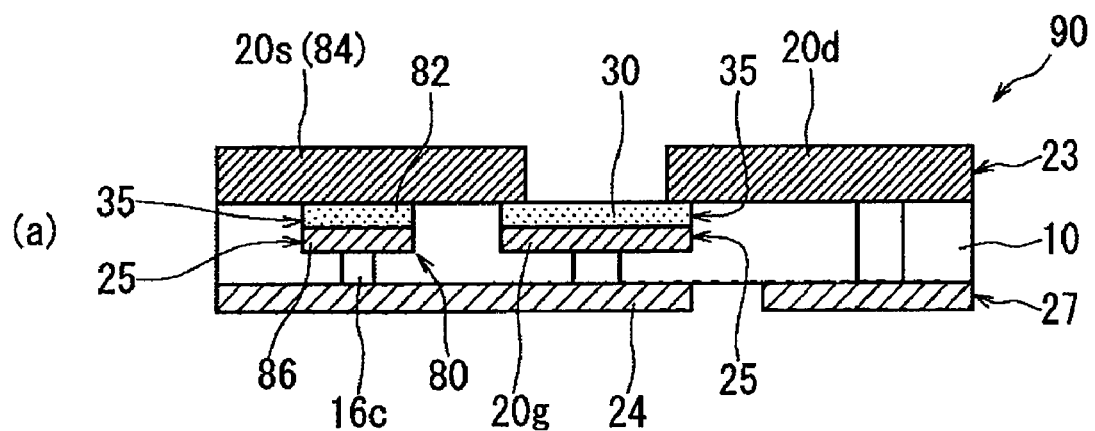
FIGS. 16(a) and 16(b) are cross-sectional views showing a modification of a manufacturing process of a flexible semiconductor device according to the embodiment.
Figure 16:
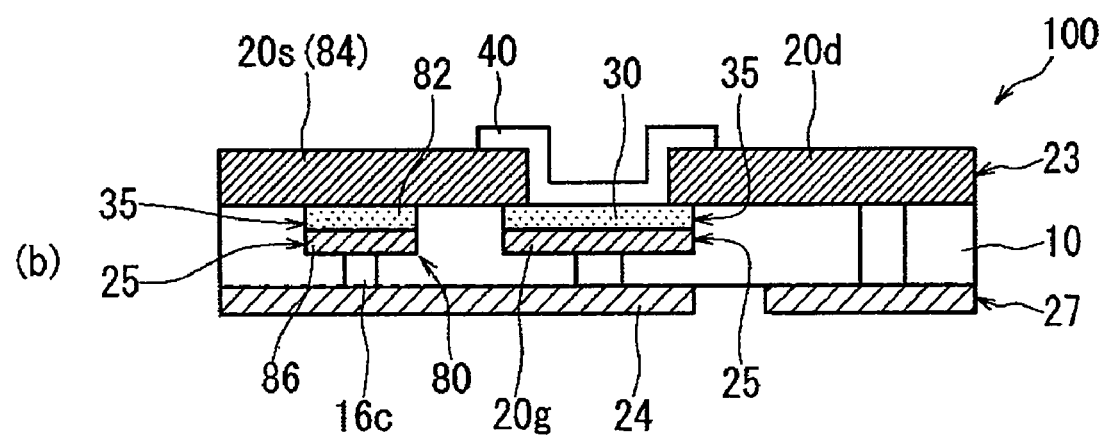

As shown in FIG. 16(a), the first metal layer 23 is then partially etched to form source/drain electrodes 20s, 20d and an upper electrode layer 84 of the capacitor. In the present embodiment, the upper electrode layer 84 is formed by the same electrode as the source electrode 20s. The third metal layer 27 is also partially etched to form a gate line 24 and a wiring connected to the lower electrode layer 86 through the via 16c. In the present embodiment, the lower electrode layer 86 is electrically connected to the gate line 24 through the via 16c. The capacitor 80 including the upper electrode layer 84, the dielectric layer 82, and the lower electrode layer 86 can thus be formed in the resin film 10.

As shown in FIG. 16(b), an organic semiconductor layer 40 is then formed in contact with the source/drain electrodes 20s, 20d and on the gate electrode 20g with the gate insulating film 30 interposed therebetween. A flexible semiconductor device 100 having the capacitor 80 can thus be formed.

According to the above manufacturing method of the flexible semiconductor device 100, the capacitor elements (the dielectric layer 82, the upper electrode layer 84, and the lower electrode layer 86) formed in the resin film 10 and the TFT structure (the gate insulating film 30, the gate electrode 20g, and the source/drain electrodes 20s, 20d) can be simultaneously fabricated, whereby a flexible semiconductor device 100 having excellent productivity can be provided.

Although some of the following examples overlap those described above, examples of the organic semiconductor material of the organic semiconductor layer 40 of the present embodiment are as follows: (1) an acene molecular material selected from the group consisting of naphthalene, anthracene, tetracene, pentacene, hexacene, and their derivatives; (2) a pigment and its derivative selected from the group consisting of phthalocyanine compounds, azo compounds, and perylene compounds; (3) a low molecular compound and its derivative selected from the group consisting of hydrazone compounds, triphenylmethane compounds, diphenylmethane compounds, stilbene compounds, arylvinyl compounds, pyrazoline compounds, triphenylamine compounds, and triarylamine compounds; and (4) a polymeric compound selected from the group consisting of poly-N-vinylcarbazole, halogenated poly-N-vinylcarbazole, polyvinylpyrene, polyvinyl anthracene, pyrene-formaldehyde resin, and ethylcarbazole-formaldehyde resin. Alternatively, the organic semiconductor material may be a fluorenone compound, a diphenoquinone compound, a benzoquinone compound, an indenone compound, a porphyrin compound, a polythiophene compound, and a polyphenylene compound.

Figure 17:
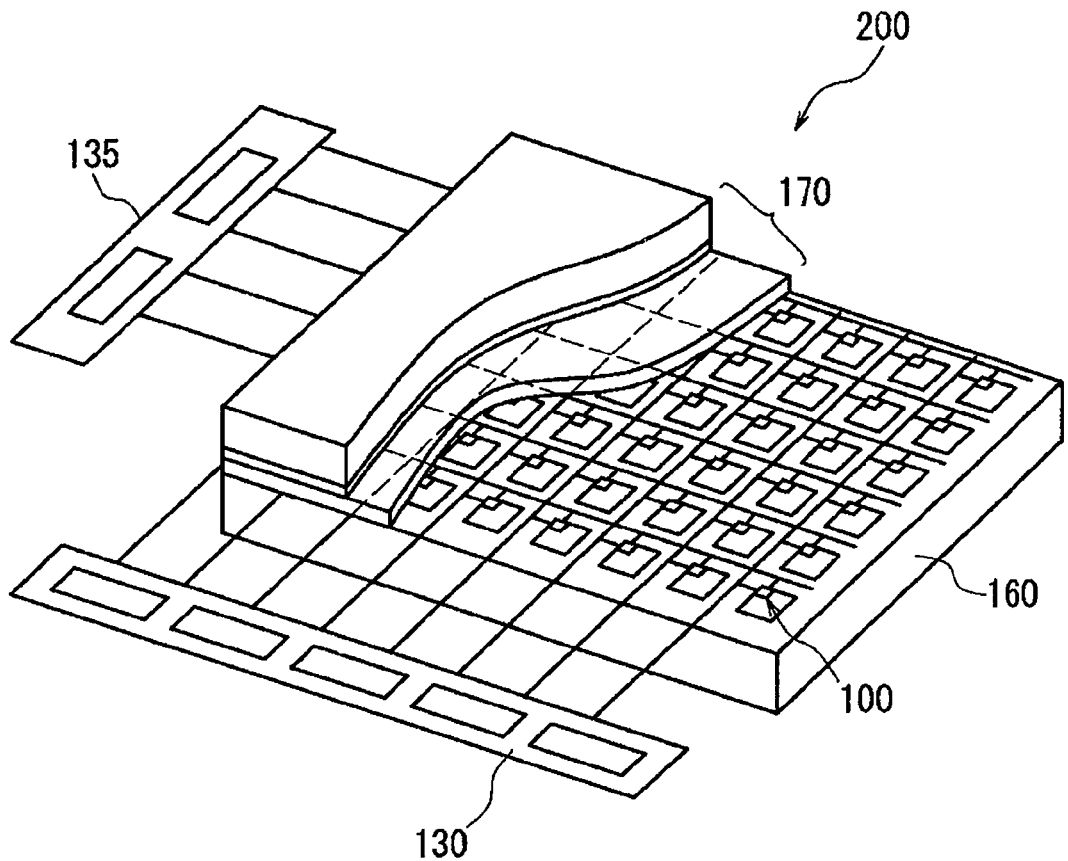
FIG. 17 is a diagram schematically showing the outer appearance of an image display device including a flexible semiconductor device.
Figure 18:
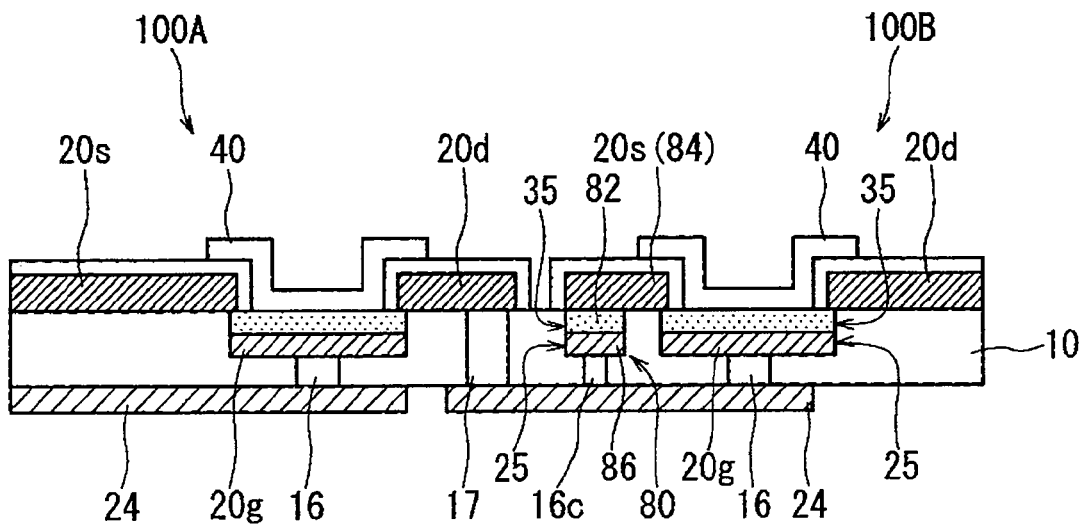
FIG. 18 is a cross-sectional view schematically showing an image display device including a flexible semiconductor device.

An image display device including the flexible semiconductor device 100 of the present embodiment will now be described with reference to FIG. 17. FIG. 17 is a perspective view showing the overall outer appearance of an image display device 200 including the flexible semiconductor device (organic semiconductor device) 100 of the present embodiment. FIG. 18 is a cross-sectional view schematically showing a part of the image display device 200.

The image display device 200 is, for example, an organic EL display. As shown in FIG. 17, the image display device 200 includes a TFT portion 160, a driver portion (130, 135), and an EL portion 170. The flexible semiconductor device 100 is included in each pixel of the TFT portion 160.

A partial cross-section of the image display device 200 is shown in FIG. 18. FIG. 18 shows two flexible semiconductor devices (organic semiconductor devices) 100 of the present embodiment; one is a switching transistor 100A and the other is a driver transistor 100B. The flexible semiconductor devices 100 (100A, 100B) are arranged on a reinforcing film (e.g., a resin film such as PET or PEN). The flexible semiconductor devices 100 (100A, 100B) are formed under organic EL elements included in the EL portion 170. The flexible semiconductor device 100 ("100B" in this example) is connected to the organic EL elements. Note that transparent electrodes are formed over the organic EL elements. A protective film (e.g., a resin film such as PET or PEN) is formed over the transparent electrodes. The flexible semiconductor device 100 ("100B" in this example) includes a capacitor 80 in a resin film 10. The capacitor 80 holds charges during a period selected by the switching transistor 100A, and a voltage generated by the charges is applied to the gate of the driver transistor 100B. A drain current according to the voltage flows through the organic EL elements, thereby causing light emission from the pixel. A dielectric layer 82 of the capacitor 80 is made of an inorganic insulating layer 35. An upper electrode layer 84 and a lower electrode layer 86 of the capacitor 80 are made of a first metal layer 23 and a second metal layer 25, respectively. In the illustrated example, the upper electrode layer 84 is a source electrode 20s made of the first metal layer 23. The lower electrode layer 86 is connected to a gate line 24 made of a third metal layer 27 through a via 16c.

Figure 19:
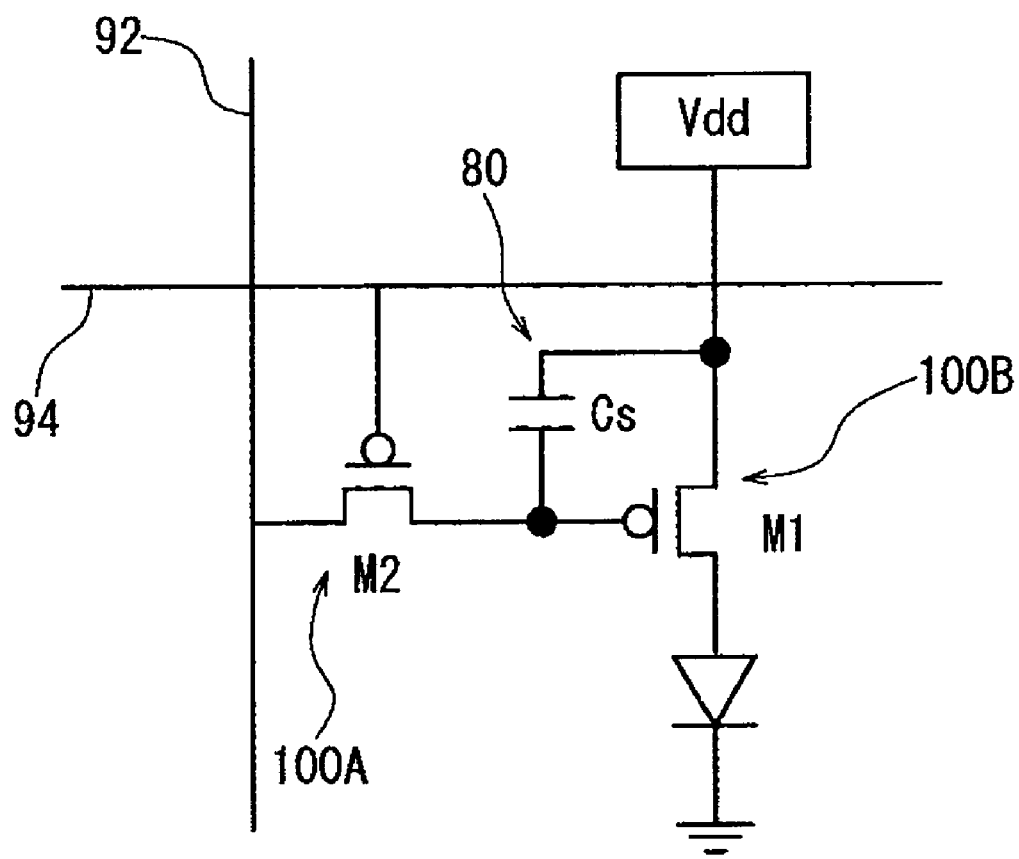
FIG. 19 is a diagram showing an equivalent circuit of the structure of FIG. 18.

FIG. 19 shows an equivalent circuit of the structure of FIG. 18. In FIG. 19, a wiring 92 is a data line and a wiring 94 is a selection line. The flexible semiconductor device 100 of the present embodiment is formed in each pixel of the image display device. Depending on the structure of the organic EL display, two or more transistors may be provided in each pixel. The flexible semiconductor device 100 of the present embodiment can therefore be arranged according to the structure of the organic EL display. Note that the flexible semiconductor device 100 of the present embodiment may be used not only in the organic EL display but also in other image display devices (e.g., a liquid crystal display device) and in electronic paper. Moreover, the flexible semiconductor device 100 of the present embodiment can be used in various applications (e.g., RF-ID, a memory, an MPU, a solar cell, and a sensor) that have been considered to be used in the printed electronics.

Although preferred embodiments of the present invention have been described above, the above description does not limit the present invention to those details and various modifications can be made. For example, the above embodiments show an example in which the flexible semiconductor device 100 is fabricated in a manner corresponding to a single device. However, the present invention is not limited to this, and a method for fabricating the flexible semiconductor device 100 in a manner corresponding to a plurality of devices may be performed. A roll-to-roll method can be used as such a fabrication method. The effects of the structure of the present embodiment can be significant and higher technical value can be obtained with the use of a high mobility organic semiconductor material that is expected to be developed in the future.

INDUSTRIAL APPLICABILITY

The manufacturing method of the flexible semiconductor device of the present invention can provide a flexible semiconductor device having excellent productivity.

The invention claimed is:

1. A method for manufacturing a flexible semiconductor device including a thin film transistor, comprising the steps of:
   (a) preparing a layered film of a three-layer clad foil formed with a first metal layer, a second metal layer, and an inorganic insulating layer interposed therebetween;
   (b) partially etching the second metal layer to form a gate electrode;
   (c) partially etching the first metal layer to form source/drain electrodes in a region corresponding to the gate electrode; and
   (d) forming a semiconductor layer in contact with the source/drain electrodes and on the gate electrode with the inorganic insulating layer interposed therebetween, wherein
   the inorganic insulating layer on the gate electrode functions as a gate insulating film, and the semiconductor layer between the source/drain electrodes on the inorganic insulating layer functions as a channel.

2. The method according to claim 1, further comprising the step of, after the step (b), pressure-contacting the gate electrode to an upper surface of a resin film to embed the gate electrode in the resin film.

3. The method according to claim 2, further comprising the step of forming a third metal layer on a lower surface of the resin film.

4. The method according to claim 3, wherein the resin film has openings extending from the upper surface to the lower surface of the resin film, a paste via is formed in the openings by filing the openings with a conductive paste, and in the step of embedding the gate electrode in the resin film, the gate electrode or/and the source/drain electrodes are pressure-contacted so as to be in contact with an upper surface of the respective paste vias.

5. The method according to claim 3, further comprising the step of, after forming the third metal layer, forming in the resin film a plating via electrically connecting the gate electrode or/and the source/drain electrodes to the third metal layer.

6. The method according to claim 3, wherein the third metal layer and a plating via electrically connecting the third metal layer to the gate electrode or/and the source/drain electrodes are formed in the step of forming the third metal layer.

7. The method according to claim 4, further comprising the step of partially etching the third metal layer to form a gate line electrically connected to the gate electrode through the via.

8. The method according to claim 7, wherein, in the step of forming the gate line, the third metal layer is partially etched to form the gate line and a wiring layer electrically connected to the source/drain electrodes.

9. The method according to claim 1, wherein the first metal layer and the second metal layer of the step (a) are made of a copper foil, a nickel foil, or an alloy foil containing one of copper and nickel.

10. The method according to claim 1, wherein the step (b) includes the step of etching the inorganic insulating layer.

11. The method according to claim 1, wherein in the step (c), the first metal layer is partially etched to form the source/drain electrodes and a wiring layer connected to the source/drain electrodes.

12. The method according to claim 1, wherein the inorganic insulating layer is made of a material selected from the group consisting of a titanium oxide, a tantalum oxide, an aluminum oxide, and a niobium oxide.

13. The method according to claim 1, wherein the inorganic insulating layer is a film having a relative dielectric constant of 8 or more and a thickness of 2 μm or less.

14. The method according to claim 1, wherein the step (a) includes the steps of preparing the second metal layer, forming the inorganic insulating layer on the second layer, and forming the first metal layer on the inorganic insulating layer.

15. The method according to claim 14, wherein the inorganic insulating layer is made of a metal oxide film formed by oxidizing an upper surface of the second metal layer.

16. The method according to claim 15, wherein the upper surface of the second metal layer is oxidized by anodization.

17. The method according to claim 15, wherein the second metal layer is made of aluminum or tantalum.

18. The method according to claim 15, wherein the metal oxide film is a surface-oxidized film having a relative dielectric constant of 8 or more and a thickness of 2 μm or less.

19. The method according to claim 1, wherein the semiconductor layer is made of an organic semiconductor material.

20. The method according to claim 1, wherein, in the step (b), the second metal layer is partially etched to simultaneously form the gate electrode and a lower electrode of a capacitor, in the step (c), the first metal layer is partially etched to simultaneously form the source/drain electrodes and an upper electrode of the capacitor, and the inorganic insulating layer between the lower electrode and the upper electrode functions as a dielectric layer of the capacitor.

* * * * *